(12) United States Patent
Nonaka et al.

(10) Patent No.: US 9,230,827 B2
(45) Date of Patent: Jan. 5, 2016

(54) METHOD FOR FORMING A RESIST UNDER LAYER FILM AND PATTERNING PROCESS

(71) Applicant: SHIN-ETSU CHEMICAL CO., LTD., Tokyo (JP)

(72) Inventors: Shiori Nonaka, Jyoetsu (JP); Seiichiro Tachibana, Jyoetsu (JP); Daisuke Kori, Jyoetsu (JP); Toshihiko Fujii, Jyoetsu (JP); Tsutomu Ogihara, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/253,497

(22) Filed: Apr. 15, 2014

(65) Prior Publication Data

US 2014/0335692 A1    Nov. 13, 2014

(30) Foreign Application Priority Data

May 8, 2013    (JP) .................................. 2013-98747

(51) Int. Cl.
*G03F 7/11*    (2006.01)
*H01L 21/3213*    (2006.01)
*G03F 7/16*    (2006.01)
(Continued)

(52) U.S. Cl.
CPC .......... *H01L 21/32139* (2013.01); *G03F 7/094* (2013.01); *G03F 7/11* (2013.01); *G03F 7/16* (2013.01); *G03F 7/168* (2013.01);
(Continued)

(58) Field of Classification Search
CPC .............. G03F 7/094; G03F 7/11; G03F 7/16; G03F 7/168; H01L 21/011; H01L 21/32139

USPC .............. 430/311, 271.1, 322, 325, 329, 330, 430/331

See application file for complete search history.

(56) References Cited

U.S. PATENT DOCUMENTS 8,450,048 B2 * 5/2013 Hatakeyama et al. ........ 430/313
8,652,757 B2 * 2/2014 Hatakeyama et al. ..... 430/271.1
(Continued)

FOREIGN PATENT DOCUMENTS

JP    A-2002-334869    11/2002
JP    A-2004-310019    11/2004
(Continued)

OTHER PUBLICATIONS

Nov. 21, 2014 Extended Search Report issued in European Application No. 14001569.4.
(Continued)

*Primary Examiner* — Amanda C Walke
(74) *Attorney, Agent, or Firm* — Oliff PLC

(57) ABSTRACT

The present invention provides a method for forming a resist under layer film used in a lithography process, comprising: a process for applying a composition for forming a resist under layer film containing an organic compound having an aromatic unit on a substrate; and a process for heat-treating the resist under layer film applied in an atmosphere whose oxygen concentration is 10% or more at 150° C. to 600° C. for 10 to 600 seconds after heat-treating the same in an atmosphere whose oxygen concentration is less than 10% at 50 to 350° C. There can be provided a method for forming a resist under layer film having excellent filling/flattening properties so that unevenness on a substrate can be flattened even in complex processes such as multi-layer resist method and double patterning.

20 Claims, 2 Drawing Sheets

(51) Int. Cl.
*H01L 21/027* (2006.01)
*H01L 21/04* (2006.01)
*G03F 7/09* (2006.01)
*H01L 21/033* (2006.01)

(52) U.S. Cl.
CPC .......... *H01L21/0274* (2013.01); *H01L 21/033* (2013.01); *H01L 21/042* (2013.01)

(56) References Cited

U.S. PATENT DOCUMENTS

| | | | |
|---|---|---|---|
| 8,663,898 B2* | 3/2014 | Ogihara et al. | 430/270.1 |
| 2002/0106909 A1 | 8/2002 | Kato et al. | |
| 2004/0191479 A1 | 9/2004 | Hatakeyama et al. | |
| 2005/0164478 A1* | 7/2005 | Chan et al. | 438/585 |
| 2005/0255712 A1 | 11/2005 | Kato et al. | |
| 2007/0238300 A1 | 10/2007 | Ogihara et al. | |
| 2008/0118860 A1 | 5/2008 | Harada et al. | |
| 2008/0150058 A1* | 6/2008 | Park | 257/432 |
| 2009/0136869 A1 | 5/2009 | Ogihara et al. | |
| 2010/0028802 A1 | 2/2010 | Konno et al. | |
| 2010/0151392 A1* | 6/2010 | Rahman et al. | 430/313 |
| 2012/0045900 A1* | 2/2012 | Watanabe et al. | 438/703 |
| 2012/0251956 A1* | 10/2012 | Rahman et al. | 430/311 |
| 2013/0026133 A1* | 1/2013 | Engelmann et al. | 216/47 |
| 2013/0184404 A1* | 7/2013 | Hatakeyama et al. | 524/592 |
| 2014/0248561 A1* | 9/2014 | Echigo et al. | 430/281.1 |

FOREIGN PATENT DOCUMENTS

| | | |
|---|---|---|
| JP | 2007199653 A * | 8/2007 |
| JP | A-2007-199653 | 8/2007 |
| JP | A-2007-302873 | 11/2007 |
| JP | A-2008-111103 | 5/2008 |
| JP | A-2009-126940 | 6/2009 |
| JP | B2-5051133 | 10/2012 |
| WO | WO 2004/066377 A1 | 8/2004 |

OTHER PUBLICATIONS

Maenhoudt et al., "Double Patterning scheme for sub-0.25 kl single damascene structures at NA=0.75, λ=193 nm," *Proceedings of SPIE*, 2005, pp. 1508-1518, vol. 5754, SPIE, Bellingham, WA.

Nakamura et al., "Contact Hole Formation by Multiple Exposure Technique in Ultra-low $k_1$ Lithography," *Proceedings of SPIE*, 2004, pp. 255-263, vol. 5377, SPIE, Bellingham, WA.

* cited by examiner

METHOD FOR FORMING A RESIST UNDER LAYER FILM AND PATTERNING PROCESS

BACKGROUND OF THE INVENTION

1. Field of the Invention

The present invention relates to a method for forming a resist under layer film used for a fine patterning in a manufacturing step of a semiconductor device, etc., and a patterning process using same.

2. Description of the Related Art

As an exposure light to be used for formation of a resist pattern, light exposure using a g-beam (436 nm) or an i-beam (365 nm) of a mercury lamp has widely been used in 1980's. As a means for further miniaturization, a method of shifting to a shorter wavelength of exposure light has been considered to be effective, so that in a mass-production process after a DRAM (dynamic random access memory) with 64 MB (processing dimension is 0.25 µm or less) in 1990's, a KrF excimer laser (248 nm) at a shorter wavelength was used as an exposure light source instead of the i-beam (365 nm). However, in production of DRAMs at integration degrees of 256 MB and 1 GB or higher which require a finer processing technique (processing dimension is 0.2 µm or less), light sources at a shorter wavelength were required, thereby a photolithography using an ArF excimer laser (193 nm) has been earnestly investigated in the past ten years. At first, the ArF lithography was intended to be firstly applied to a device fabrication of a 180 nm node device, but the KrF excimer lithography was prolonged in life to a mass-production of a 130 nm node device, so that the ArF lithography was firstly and fully applied to a 90 nm node. Further, such a technique was combined with a lens having an NA increased to 0.9, thereby conducting a mass-production of a 65 nm node device. For the next 45 nm node device, further shortening of a wavelength of the exposure light was progressing, and the $F_2$ lithography with a wavelength of 157 nm was considered to be a candidate. However, development of the $F_2$ lithography has stopped due to various problems such as an increased cost of a scanner since an expensive $CaF_2$ single crystal is used for a projection lens with a large amount, an optical system shall be changed accompanying with introduction of a hard pellicle instead of a soft pellicle having extremely low durability, etching resistance of the resist film is lowered, etc., whereby an ArF liquid immersion lithography has been introduced.

In the ArF liquid immersion lithography, such water having a refractive index of 1.44 was introduced between a projection lens and a wafer by a partial filling manner, thereby enabling a high-speed scanning to conduct mass-production of a 45 nm node device by means of a lens having an NA of about 1.3.

As a candidate of lithography technique for a 32 nm node, vacuum ultraviolet light (EUV) lithography with a wavelength of 13.5 nm has been mentioned. As problems of the EUV lithography, there may be mentioned a laser to be increased in output, a resist film to be increased in higher sensitivity, a resolution to be enhanced, a line edge roughness (LER) to be lowered, an MoSi laminated mask to be free of defects, reflective mirror aberrations to be lowered, etc., whereby the problems to be overcome are piled up. The development of the high refractive index liquid immersion lithography which is another candidate as a technique for a 32 nm node has stopped since the LUAG, a candidate of a high refractive index lens, exhibits a lower transmittance, and it has been impossible to obtain a liquid having a refractive index increased to a targeted value of 1.8. Thus, in the light exposure used as a general-purpose technique, it is approaching the essential limit of the resolution derived from the wavelength of the light sources.

Thus, as one of the miniaturization techniques attracted attention in recent years, there is a double patterning process which forms a pattern by the first time exposure and development, and forms a pattern by the second time exposure at just between the patterns of the first time (Non-Patent Document 1). As the method of the double patterning, many processes have been proposed. For example, (1) it may be mentioned a method in which a photoresist pattern with a distance of the line and the space of 1:3 is formed by the first time exposure and development, the hard mask of the under layer is processed by the dry etching, a hard mask is further provided thereon with another layer, a line pattern is formed at the first time exposure space portion by exposure and development of the photoresist film, the hard mask is processed by dry etching to form a line and space pattern with a half pitch of the initial pattern. Also, (2) a photoresist pattern with a distance of the space and the line of 1:3 is formed by the first time exposure and development, a hard mask which is an under layer is processed by dry etching, a photoresist film is coated thereon, a space pattern of the second time is exposed to the portion at which the hard mask is remained, and the hard mask is processed by dry etching. Here, in the method (1), the hard mask must be prepared twice, while in the method (2), formation of the hard mask is performed once, but a trench pattern shall be formed, which is difficult to resolve as compared with the line pattern. Also, in both of the methods, the procedures for processing the hard mask by dry etching are performed twice.

As the other miniaturization techniques, there has been proposed a method in which a line pattern in the X-direction is formed on the positive type resist film using a dipole illumination, the resist pattern is cured, a resist material is again coated thereon, a line pattern in the Y-direction is exposed by a dipole illumination, whereby a hole pattern is formed from gaps of the latticed line pattern (Non-Patent Document 2).

As one of the methods for transferring a lithography pattern to a substrate by utilizing the hard mask, there is a multi-layer resist method. The multi-layer resist method comprises interposing an under layer film, e.g., a silicon-containing resist under layer film, having different etching selectivity from that of a photoresist film, i.e., a resist upper layer film between the resist upper layer film and a substrate to be processed, after obtaining a pattern onto the resist upper layer film, the pattern thus obtained is transferred onto the resist under layer film by dry etching using the resist upper layer film pattern as an etching mask, and further, the pattern thus obtained is transferred onto the substrate to be processed by dry etching using the resist under layer film pattern as an etching mask.

In addition, as mentioned above, finer substrate processing has recently been more complex. Specifically, it is increasingly important to flatten unevenness on a substrate using a resist under layer film in order to reduce a change in thickness of a resist intermediate film and a resist upper layer film formed thereon. This flattening process can enlarge focus margin of lithography to obtain a favorable process margin. Under the circumstances, a method for forming a resist under layer film having excellent filling/flattening properties is strongly demanded so that unevenness on a substrate can be flattened even in complex processes such as a multi-layer resist method and a double patterning.

PRIOR ART DOCUMENTS

Non-Patent Documents

Non-Patent Document 1: Proc. SPIE Vol. 5754 p 1508 (2005)
Non-Patent Document 2: Proc. SPIE Vol. 5377 p 255 (2004)

SUMMARY OF THE INVENTION

The present invention was made in view of the above situation, and has an object to provide a method for forming a resist under layer film having excellent filling/flattening properties so that unevenness on a substrate can be flattened even in complex processes such as multi-layer resist method and double patterning.

To solve the above-mentioned problems, the present invention provides a method for forming a resist under layer film used in a lithography process, comprising: a process for applying a composition for forming a resist under layer film containing an organic compound having an aromatic unit on a substrate; and a process for heat-treating the resist under layer film applied in an atmosphere whose oxygen concentration is 10% or more at 150° C. to 600° C. for 10 to 600 seconds after heat-treating the same in an atmosphere whose oxygen concentration is less than 10% at 50 to 350° C.

The resist under layer film formed using the method for forming a resist under layer film can be a resist under layer film having excellent filling/flattening properties so that unevenness on a substrate can be flattened.

As the organic compound having an aromatic unit, an organic compound having a structure shown by the following general formula (1) and/or a structure shown by the following general formula (2) as a repeating unit is preferably used,

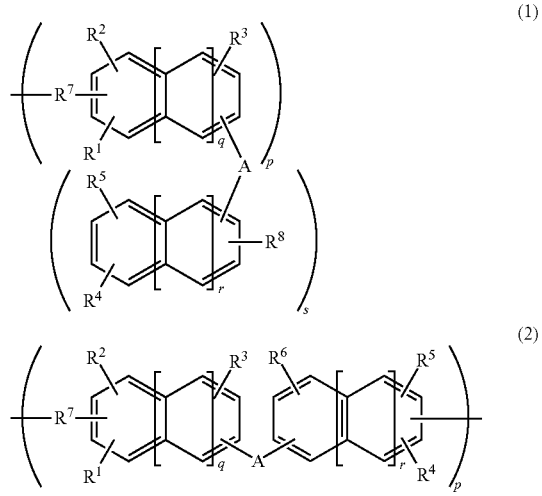

wherein, $R^1$, $R^2$, $R^3$, $R^4$, $R^5$, and $R^6$ represent mutually identical or different hydrogen atoms, hydroxyl groups, or monovalent organic groups having 1 to 20 carbon atoms; and $R^7$ represents a single bond or a divalent organic group having 1 to 20 carbon atoms. "A" represents a single bond or a divalent organic group having 1 to 30 carbon atoms. "q" and "r" represent 0, 1, or 2; "s" represents 0 or 1; and "p" represents an optional natural number so that the weight average molecular weight is 100,000 or less.

Accordingly, a resist under layer film having more excellent filling/flattening properties and favorable etching resistance can be obtained.

Further, the present invention provides a patterning process, wherein a resist under layer film is formed on a substrate to be processed by using the above-mentioned method for forming a resist under layer film, a silicon-containing resist intermediate film is formed on the resist under layer film by using a composition for forming the silicon-containing resist intermediate film, a resist upper layer film is formed on the silicon-containing resist intermediate film by using a composition for forming the resist upper layer film, a circuit pattern is formed with the resist upper layer film, the silicon-containing resist intermediate film is etched by using the resist upper layer film having the formed pattern as a mask, the resist under layer film is etched by using the silicon-containing resist intermediate film having the formed pattern as a mask, and then the substrate to be processed is etched by using the resist under layer film having the formed pattern as a mask to form the pattern on the substrate to be processed.

In such a tri-layer resist process using the silicon-containing resist intermediate film, if a pattern is formed by lithography using the method for forming a resist under layer film of the present invention, a fine pattern can be formed to the substrate to be processed with high precision.

Also, the present invention provides a patterning process, wherein a resist under layer film is formed on a substrate to be processed by using the above-mentioned method for forming a resist under layer film, a silicon-containing resist intermediate film is formed on the resist under layer film by using a composition for forming the silicon-containing resist intermediate film, an organic antireflection film is formed on the silicon-containing resist intermediate film, a resist upper layer film is formed on the organic antireflection film by using a composition for forming the resist upper layer film to provide a four-layer resist film, a circuit pattern is formed with the resist upper layer film, the organic antireflection film and the silicon-containing resist intermediate film are etched by using the resist upper layer film having the formed pattern as a mask, the resist under layer film is etched by using the silicon-containing resist intermediate film having the formed pattern as a mask, and then the substrate to be processed is etched by using the resist under layer film having the formed pattern as a mask to form the pattern on the substrate to be processed.

Thus, in the patterning process of the present invention, the organic antireflection film can be formed between the silicon-containing resist intermediate film and the resist upper layer film.

Also, the present invention provides a patterning process, wherein a resist under layer film is formed on a substrate to be processed by using the above-mentioned method for forming a resist under layer film, a titanium-containing resist intermediate film is formed on the resist under layer film by using a composition for forming the titanium-containing resist intermediate film, a resist upper layer film is formed on the titanium-containing resist intermediate film by using a composition for forming the resist upper layer film, a circuit pattern is formed with the resist upper layer film, the titanium-containing resist intermediate film is etched by using the resist upper layer film having the formed pattern as a mask, the resist under layer film is etched by using the titanium-containing resist intermediate film having the formed pattern as a mask, and then an etching residue of the titanium-containing resist intermediate film is cleaned and removed with a cleaning liquid containing hydrogen peroxide.

In such a tri-layer resist process using the titanium-containing resist intermediate film, if a pattern is formed by lithography using the method for forming a resist under layer film of the present invention, a fine pattern can be formed to the substrate to be processed with high precision.

Also, the present invention provides a patterning process, wherein a resist under layer film is formed on a substrate to be processed by using the above-mentioned method for forming a resist under layer film, a titanium-containing resist intermediate film is formed on the resist under layer film by using a composition for forming the titanium-containing resist intermediate film, an organic antireflection film is formed on the titanium-containing resist intermediate film, a resist upper layer film is formed on the organic antireflection film by using a composition for forming the resist upper layer film to provide a four-layer resist film, a circuit pattern is formed with the resist upper layer film, the organic antireflection film and the titanium-containing resist intermediate film are etched by using the resist upper layer film having the formed pattern as a mask, the resist under layer film is etched by using the titanium-containing resist intermediate film having the formed pattern as a mask, and then an etching residue of the titanium-containing resist intermediate film is cleaned and removed with a cleaning liquid containing hydrogen peroxide.

Thus, if the organic antireflection film is formed on the titanium-containing resist intermediate film as mentioned above, owing to two antireflective layers, reflection can be suppressed even in an immersion exposure with a high NA beyond 1.0.

Also, the present invention provides a patterning process, wherein a resist under layer film is formed on a substrate to be processed by using the above-mentioned method for forming a resist under layer film, any of inorganic hard mask intermediate film selected from a silicon oxide film, a silicon nitride film, a silicon oxynitride film, and an amorphous silicon film is formed on the resist under layer film, a resist upper layer film is formed on the inorganic hard mask intermediate film by using a composition for forming the resist upper layer film, a circuit pattern is formed with the resist upper layer film, the inorganic hard mask intermediate film is etched by using the resist upper layer film having the formed pattern as a mask, the resist under layer film is etched by using the inorganic hard mask intermediate film having the formed pattern as a mask, and then the substrate to be processed is etched by using the resist under layer film having the formed pattern as a mask to form the pattern on the substrate to be processed.

In such a tri-layer resist process using the inorganic hard mask intermediate film, if a pattern is formed by lithography using the method for forming a resist under layer film of the present invention, a fine pattern can be formed to the substrate to be processed with high precision.

Also, the present invention provides a patterning process, wherein a resist under layer film is formed on a substrate to be processed by using the above-mentioned method for forming a resist under layer film, any of inorganic hard mask intermediate film selected from a silicon oxide film, a silicon nitride film, a silicon oxynitride film, and an amorphous silicon film is formed on the resist under layer film, an organic antireflection film is formed on the inorganic hard mask intermediate film, a resist upper layer film is formed on the organic antireflection film by using a composition for forming the resist upper layer film to provide a four-layer resist film, a circuit pattern is formed with the resist upper layer film, the organic antireflection film and the inorganic hard mask intermediate film are etched by using the resist upper layer film having the formed pattern as a mask, the resist under layer film is etched by using the inorganic hard mask intermediate film having the formed pattern as a mask, and then the substrate to be processed is etched by using the resist under layer film having the formed pattern as a mask to form the pattern on the substrate to be processed.

Thus, if the organic antireflection film is formed on the inorganic hard mask intermediate film as mentioned above, owing to two antireflective layers, reflection can be suppressed even in an immersion exposure with a high NA beyond 1.0. In addition, in so doing, a footing profile of the resist upper layer film pattern on the inorganic hard mask intermediate film can be reduced.

Further, the inorganic hard mask intermediate film can be formed by a CVD method or an ALD method.

Thus, if the inorganic hard mask intermediate film is formed by the CVD method or the ALD method, etching resistance can be improved.

Further, the patterning of the resist upper layer film can be conducted by any of the method of photolithography with a high energy beam having a wavelength of 300 nm or less, the method of a direct drawing with an electron beam, the nano-imprinting method, or a combination of these methods.

Thus, the resist upper layer film can be patterned by any of the method of photolithography with a high energy beam having a wavelength of 300 nm or less, the method of a direct drawing with an electron beam, the nano-imprinting method, or a combination of these methods.

Further, the resist upper layer film is preferably patterned by alkaline development or organic solvent development.

Thus, alkaline development or organic solvent development can be used in the present invention.

Further, as the substrate to be processed, a semiconductor substrate coated with any of a metal film, a metal carbide film, a metal oxide film, a metal nitride film, and a metal oxynitride film can be used.

As the metal that constitutes the substrate to be processed, silicon, titanium, tungsten, hafnium, zirconium, chromium, germanium, copper, aluminum, indium, gallium, arsenic, palladium, iron, tantalum, iridium, molybdenum or an alloy of these metals can be used.

Thus, in the patterning process of the present invention, a pattern can be formed by processing the substrate to be processed.

As described above, a resist under layer film formed by using the method for forming a resist under layer film of the present invention has excellent filling/flattening properties, and has no damage to other properties such as etching resistance. Therefore, it is significantly useful in patterning in a multi-layer resist process, e.g. a silicon- or a titanium-containing bi-layer resist process, a tri-layer resist process using a silicon- or a titanium-containing intermediate film, or a four-layer resist process using a silicon- or a titanium-containing intermediate film and an organic antireflection film.

DETAILED DESCRIPTION OF THE PREFERRED EMBODIMENTS

Figure 1:
FIG. 1 is a SEM cross-sectional photograph showing a cut substrate obtained by applying SOL-1 on a substrate and heat-treating the same in two steps as an Example.

Hereinafter, the present invention will be explained. As stated above, development of a method for forming a resist under layer film having excellent filling/flattening properties is demanded so that unevenness on a substrate can be flattened in a complex process such as multi-layer resist method and double patterning.

Inventors of the present invention have intensively studied to achieve the above-mentioned object, and as a result, they have found out that in the case of forming a resist under layer film by using an organic compound having an aromatic unit, a resist under layer film having excellent filling/flattening properties can be obtained by separating a flattening process and a crosslinking hardening process of a resist under layer film; and based on this finding, the present invention could be completed.

Hereinafter, embodiments of the present invention will be described, but the present invention is not limited by them.

The present invention is a method for forming a resist under layer film used in a lithography process, comprising: a process for applying a composition for forming a resist under layer film containing an organic compound having an aromatic unit on a substrate; and a process for heat-treating the resist under layer film applied in an atmosphere whose oxygen concentration is 10% or more at 150° C. to 600° C. for 10 to 600 seconds after heat-treating the same in an atmosphere whose oxygen concentration is less than 10% at 50 to 350° C.

In an oxidative atmosphere, a carbon atom of the aromatic ring contained in polymer in the composition for forming a resist under layer film and another carbon atom of the aromatic ring cause a crosslinking reaction by oxidative coupling, and the polymers bond together, thereby as a result, the composition for forming a resist under layer film containing an organic compound having an aromatic unit used in the present invention becomes a resist under layer film whose polymers are entirely crosslinked.

A method for crosslinking a resist under layer film in an oxidative atmosphere is known as the one proposed in e.g. Japanese Patent No. 5051133. However, the method disclosed in the Japanese Patent fails to disclose a method for forming a resist under layer film for flattening unevenness on a substrate, providing no improvement in specific flattening properties.

In the present invention, a first flattening process flattens unevenness on a resist under layer film surface corresponding to an uneven shape on a substrate through thermal hydraulics of polymers by heating the polymers in a non-oxidative atmosphere without causing a crosslinking reaction. Subsequently, a second crosslinking hardening process hardens polymers by heating a resist under layer film in an oxidative atmosphere and causing a crosslinking reaction of polymers in the resist under layer film flattened through thermal hydraulics. Thus, by separating a flattening process through thermal hydraulics and a crosslinking hardening process in an oxidative atmosphere, a resist under layer film excellent in flattening properties can be obtained.

In the flattening process, heat-treatment of the resist under layer film is conducted in an atmosphere whose oxygen concentration is less than 10% at 50° C. to 350° C. If the heat-treatment is conducted in an atmosphere whose oxygen concentration is 10% or more or at 350° C. or more, the film is hardened and fluidity of polymers is damaged, thereby flattening properties deteriorate. If the heat-treatment is conducted at less than 50° C., thermal hydraulics of the polymers does not cause and flattening properties deteriorate. In addition, the time for heat-treatment can optionally be determined as long as unevenness on a substrate can be flattened, and is not particularly restricted, but is 10 to 300 seconds, and more preferably 20 to 100 seconds.

In the crosslinking hardening process, heat-treatment of the resist under layer film is conducted in an atmosphere whose oxygen concentration is 10% or more at 150° C. to 600° C. for 10 to 600 seconds. If the heat-treatment is conducted in an atmosphere whose oxygen concentration is less than 10% or at less than 150° C., polymers are not sufficiently hardened and the film is dissolved when a resist is applied on upper layer. Also, if the heat-treatment is conducted at 600° C. or more, compounds contained in polymers decompose. Also, if the time for heat-treatment is determined for less than 10 seconds, polymers are not sufficiently hardened and the film is dissolved when a resist is applied on upper layer. In addition, if the heat-treatment is conducted in the above oxygen concentrations and temperature conditions, the polymers are sufficiently hardened within 600 seconds. Therefore, there is no more effect observed even if the heat-treatment is conducted for more than 600 seconds. The time for heat-treatment is preferably 10 to 300 seconds, and more preferably 20 to 100 seconds.

Further, by using the method for forming a resist under layer film of the present invention, the resist under layer film can be hardened in a crosslinking hardening process and be insolubilized to a solvent. Specific examples of the solvent include an alcohol derivative, an alkylene glycol derivative, cyclic ketone, lactone, an oxyacid derivative and a mixture thereof.

In addition, as the organic compound having an aromatic unit, an organic compound having a structure shown by the following general formula (1) and/or a structure shown by the following general formula (2) as a repeating unit is preferably used,

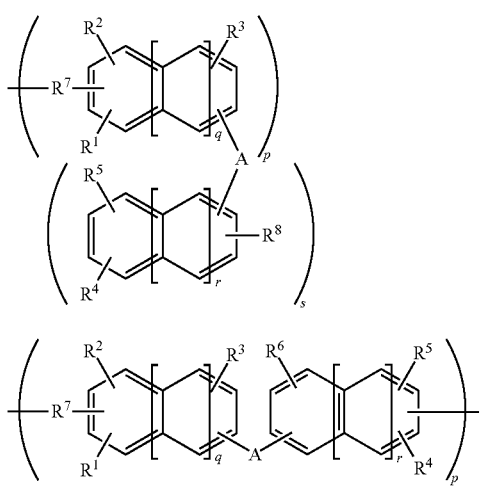

wherein, $R^1$, $R^2$, $R^3$, $R^4$, $R^5$, and $R^6$ represent mutually identical or different hydrogen atoms, hydroxyl groups, or monovalent organic groups having 1 to 20 carbon atoms; $R^7$ represents a single bond or a divalent organic group having 1 to 20 carbon atoms. "A" represents a single bond or a divalent organic group having 1 to 30 carbon atoms. "q" and "r" represent 0, 1, or 2; "s" represents 0 or 1; and "p" represents an optional natural number so that the weight average molecular weight is 100,000 or less.

In the above formula (1) and (2), $R^1$, $R^2$, $R^3$, $R^4$, $R^5$, and $R^6$ represent mutually identical or different hydrogen atoms, hydroxyl groups, or monovalent organic groups having 1 to 20 carbon atoms. Among them, as the monovalent organic group, a methyl group, an ethyl group, a n-propyl group, an isopropyl group, a n-butyl group, a sec-butyl group, a tert-butyl group, a n-pentyl group, a neopentyl group, a n-hexyl group, a n-heptyl group, a n-octyl group, a n-nonyl group, a n-decyl group, a n-dodecyl group, a n-pentadecyl group, a n-eicosyl group, a cyclopentyl group, a cyclohexyl group, a cyclopentylmethyl group, a cyclohexylmethyl group, a cyclopentylethyl group, a cyclohexylethyl group, a cyclopentylbutyl group, a cyclohexylbutyl group, an adamantyl group, a methoxy group and a glycidyloxy group etc., can be exemplified.

In the above formula (1) and (2), $R^7$ represents a single bond or a divalent organic group having 1 to 20 carbon atoms. As the above-mentioned $R^7$, a carbon atom substituted by 0 to 2 alkyl group or aryl group, which is derived from condensation reaction of formyl group or carbonyl group and aromatic ring, or a divalent crosslinking organic group having the said carbon atom, can be specifically exemplified.

In the above formula (1) and (2), "A" represents a single bond or a divalent organic group having 1 to 30 carbon atoms. As the above-mentioned "A", a carbon atom substituted by 0 to 2 alkyl group or aryl group, which is derived from condensation reaction of formyl group or carbonyl group and aromatic ring, or a divalent crosslinking organic group having the said carbon atom, can be specifically exemplified.

Naphthalene derivative can be exemplified as a monomer for synthesizing the polymer having a structure represented by the above formula (1) or (2). Naphthalene derivative includes, for example, naphthalene, 1-methylnaphthalene, 2-methylnaphthalene, 1,3-dimethylnaphthalene, 1,5-dimethylnaphthalene, 1,7-dimethylnaphthalene, 2,7-dimethylnaphthalene, 2-vinylnaphthalene, 2,6-divinylnaphthalene, acenaphthene, acenaphthylene, anthracene, 1-methoxynaphthalene, 2-methoxynaphthalene, 1,4-dimethoxynaphthalene, 2,7-dimethoxynaphthalene, 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 2-methoxycarbonyl-1-naphthol, 1-(4-hydroxyphenyl)naphthalene, 6-(4-hydroxyphenyl)-2-naphthol, 6-(cyclohexyl)-2-naphthol, 1,1'-bis-2,2'-naphthol, 6,6'-bis-2,2'-naphthol, 6-hydroxy-2-vinylnaphthalene, 1-hydroxymethylnaphthalene, 2-hydroxymethylnaphthalene, 9,9-bis(6-hydroxy-2-naphthyl)fluorene, and the like.

Benzene derivative can be exemplified as a monomer for synthesizing the polymer having a structure represented by the above formula (1) or (2). Benzene derivative includes, for example, toluene, o-xylene, m-xylene, p-xylene, cumene, indane, indene, mesitylene, biphenyl, fluorene, phenol, anisole, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, 4-phenylphenol, tritylphenol, pyrogallol, thymol, phenylglycidylether, 4-fluorophenol, 3,4-difluorophenol, 4-trifluoromethylphenol, 4-chlorophenol, 9,9-bis(4-hydroxyphenyl)fluorene, styrene, 4-t-butoxystyrene, 4-acetoxystyrene, 4-methoxystyrene, divinylbenzene, benzylalcohol, and the like.

Each of the monomers may be used singly, or in a combination of two or more kinds thereof in order to control n-value, k-value, and an etching resistance.

As specific examples of the monomer for synthesizing the polymer having a structure represented by the above formula (1) and (2), monomers represented by following structural formula can be exemplified.

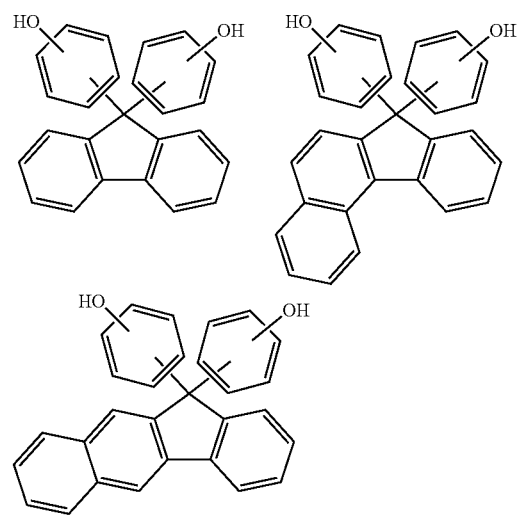

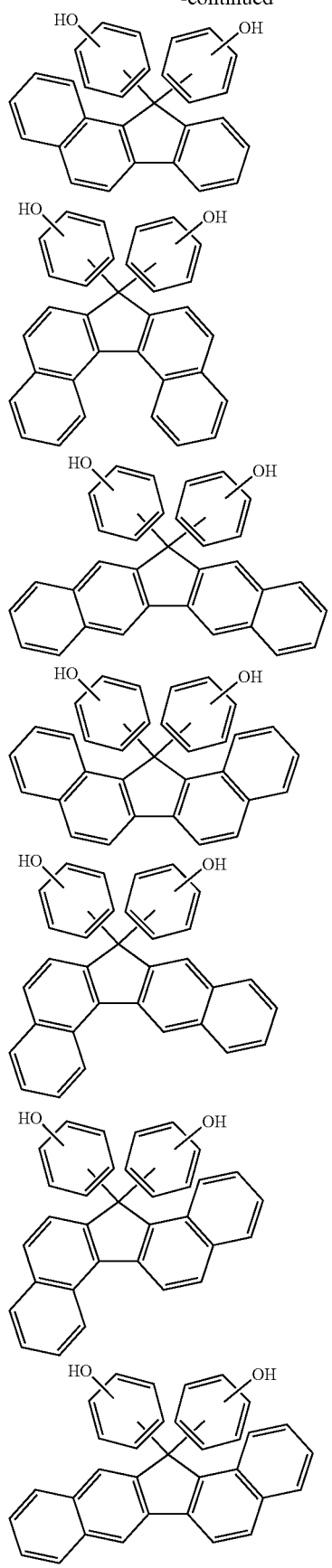
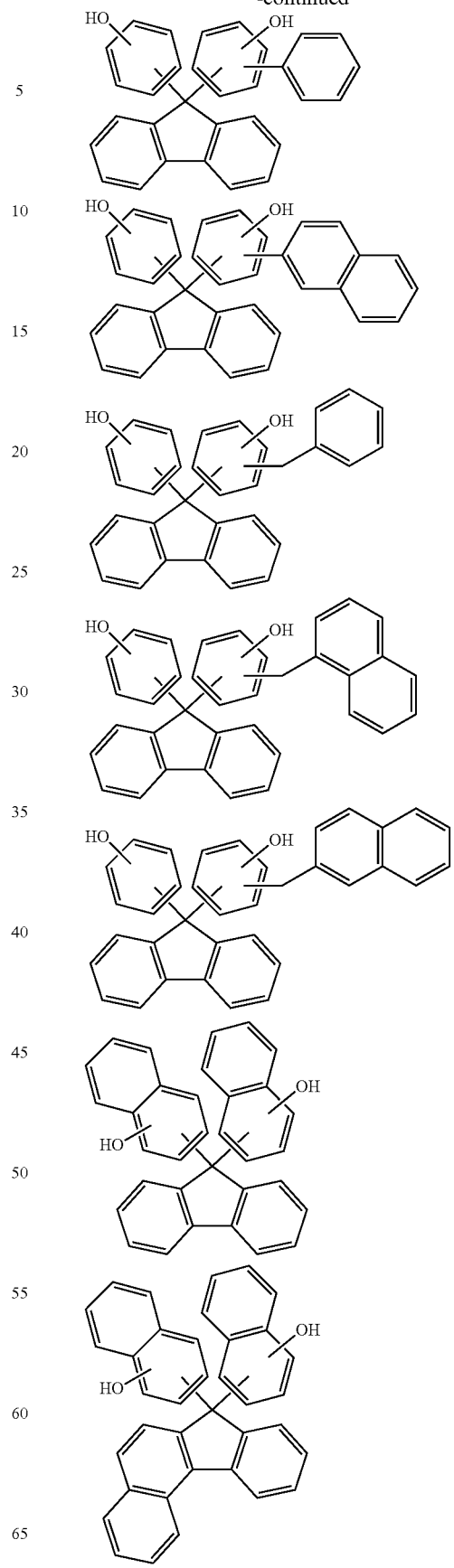

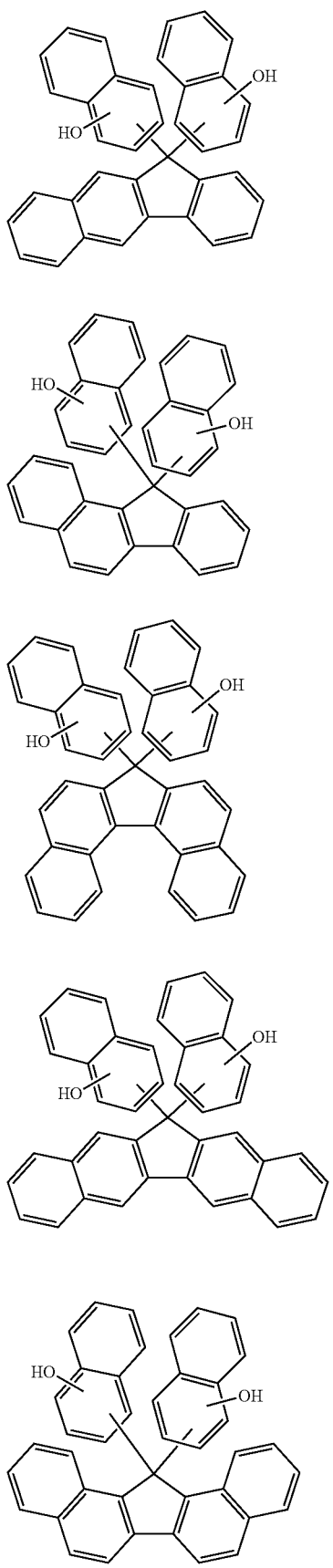
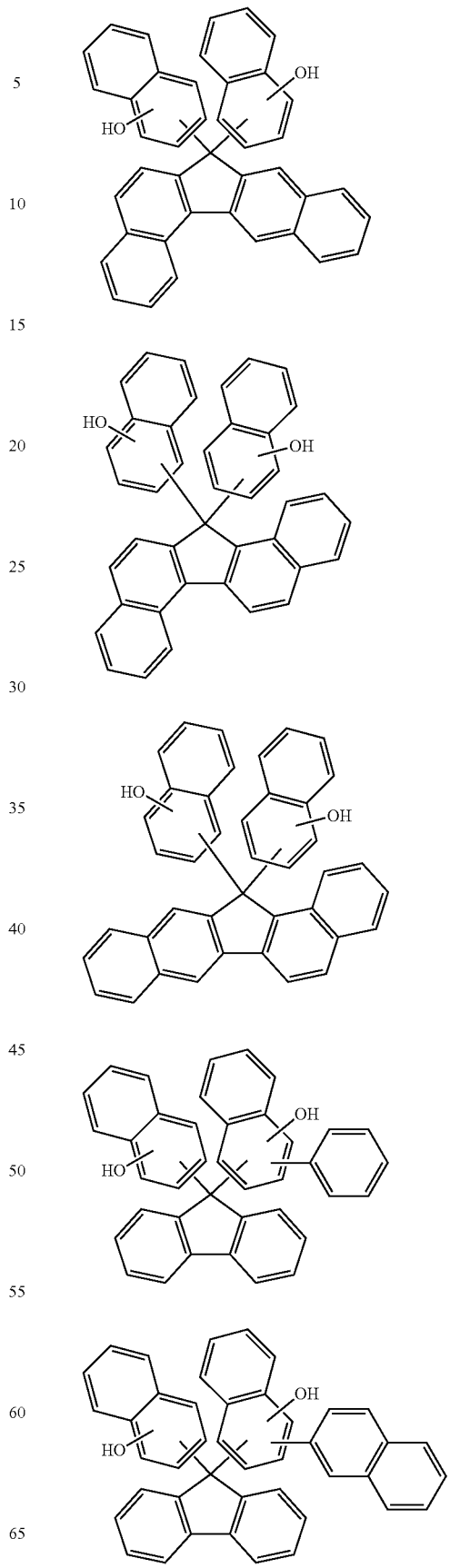

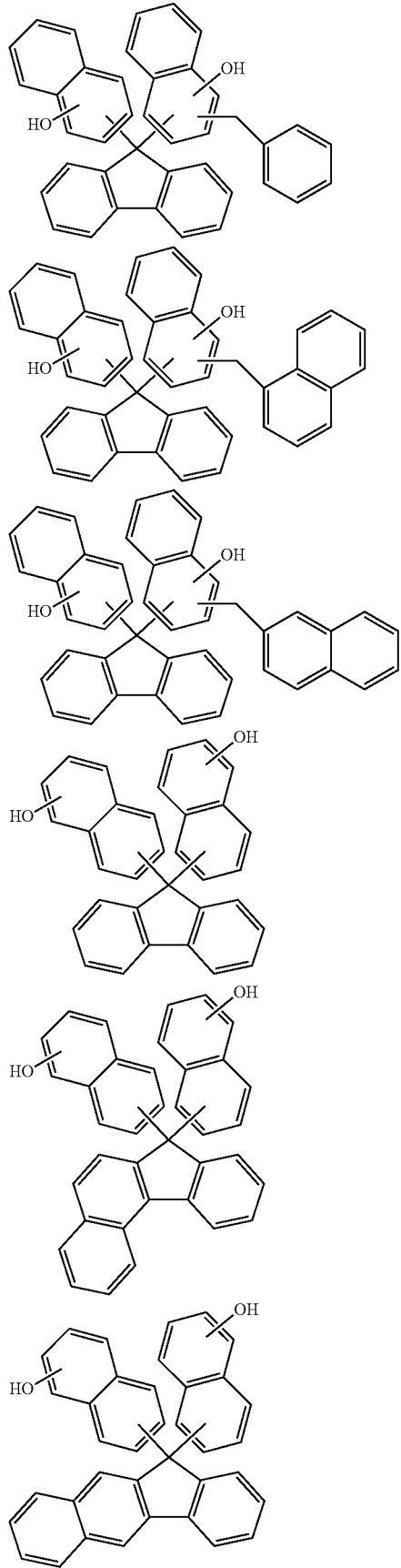
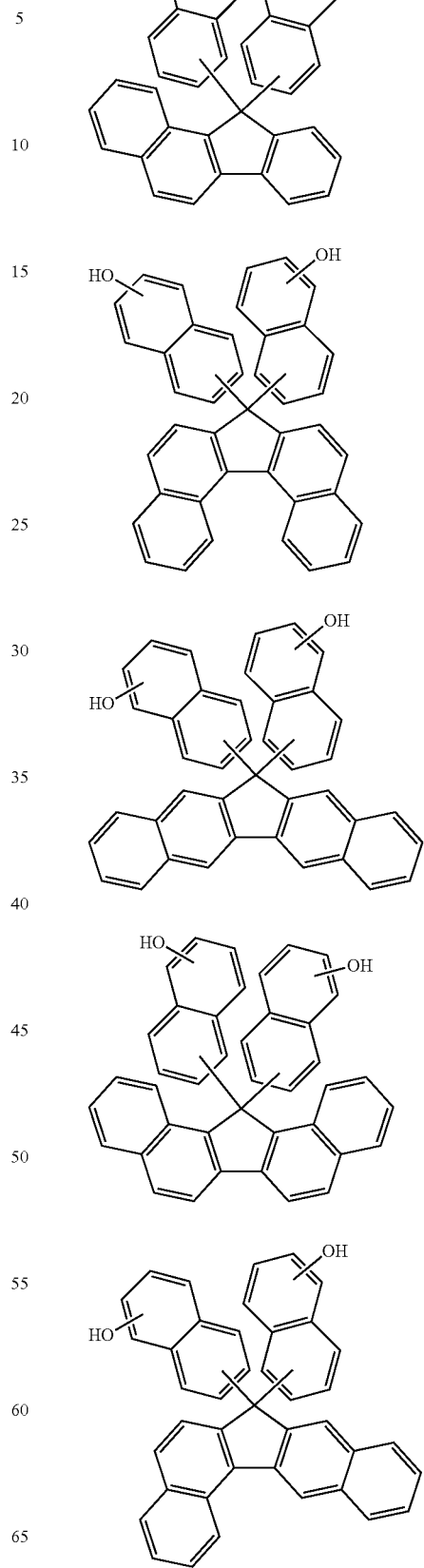

-continued
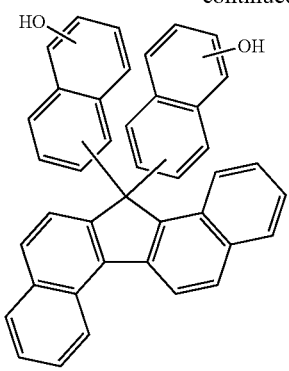
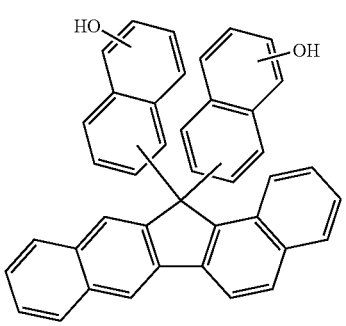
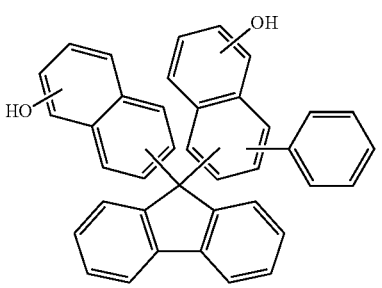
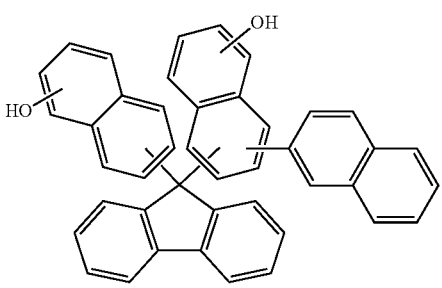
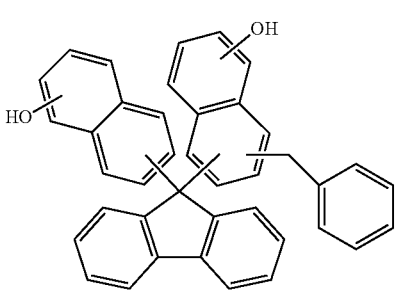
-continued
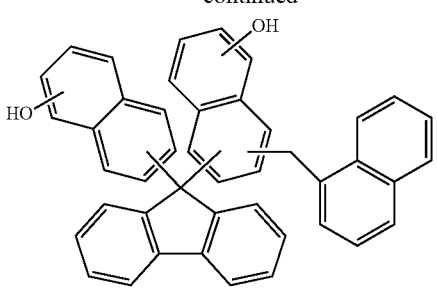
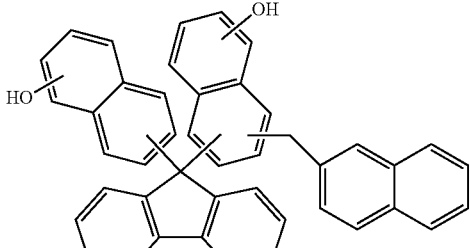
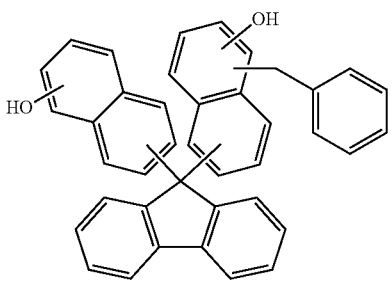
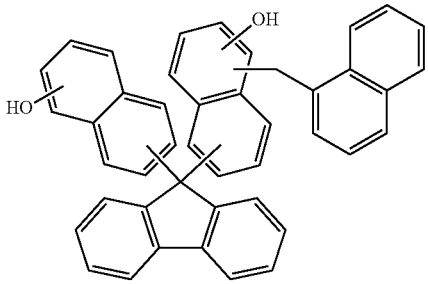
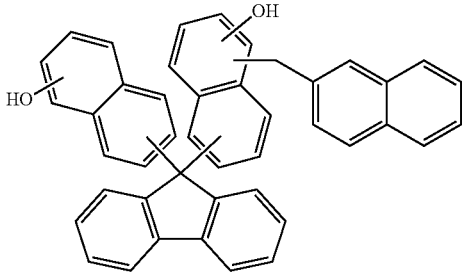
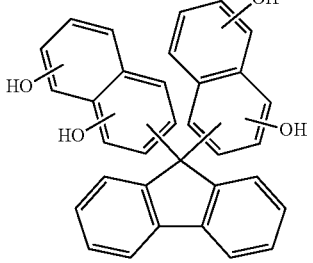

-continued
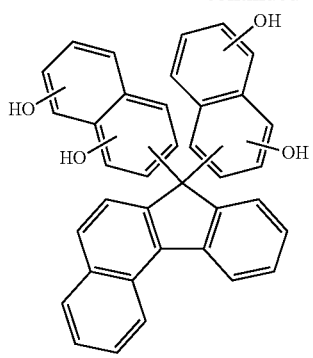
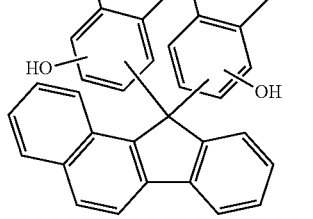
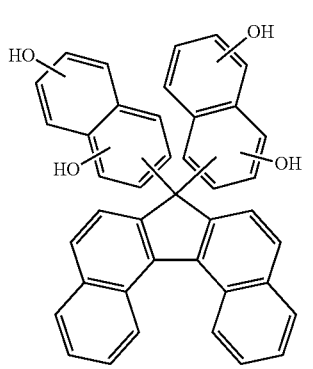
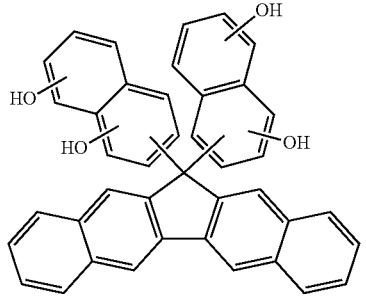
-continued
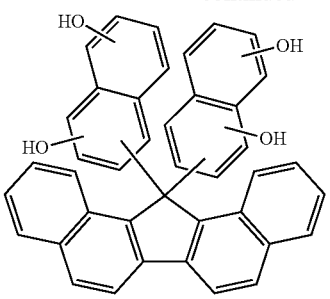
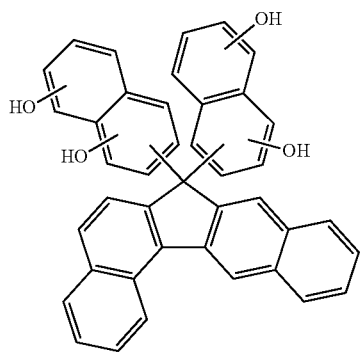
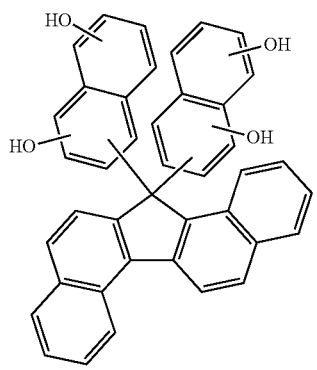
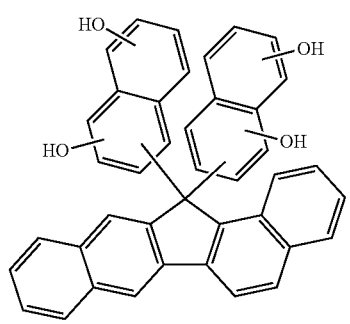
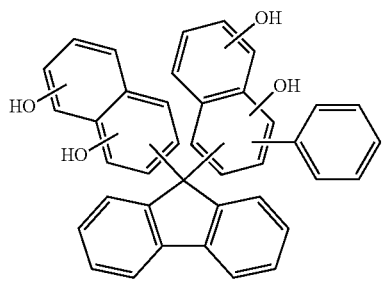

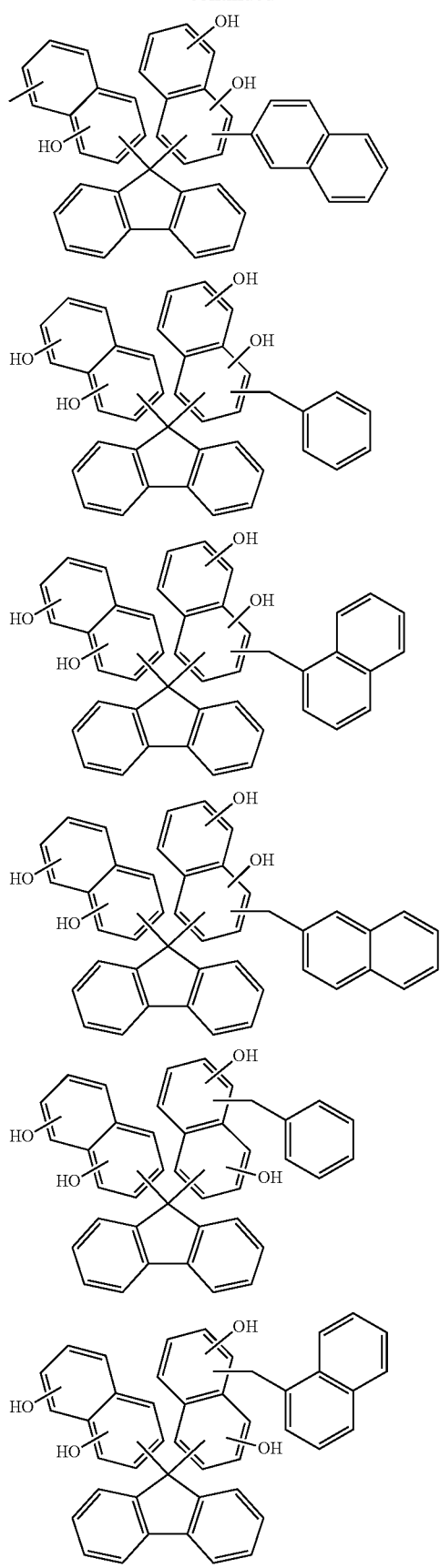
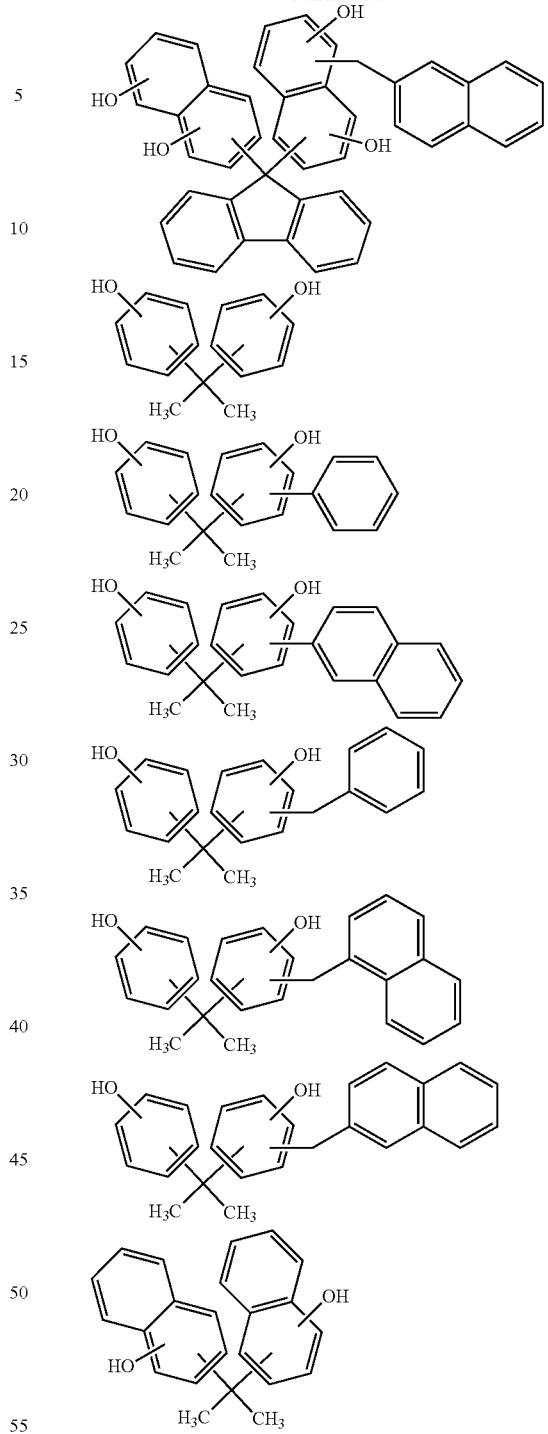

As an aldehyde compound for synthesizing the polymer having a structure represented by the above formula (1) and (2), an aldehyde compound shown by the following general formula (3) may be used.

X—CHO     (3)

(X represents a hydrogen atom or an optionally-substituted monovalent organic group having 1 to 30 carbon atoms).

Examples of the aldehyde compound represented by the above formula (3) include formaldehyde, trioxane, paraformaldehyde, acetaldehyde, propylaldehyde, adamantanecarboaldehyde, benzaldehyde, phenylacetaldehyde, α-phenylpropylaldehyde, β-phenylpropylaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthylaldehyde, 2-naphthylaldehyde, anthracenecarboaldehyde, pyrenecarboaldehyde, furfural, methylal, phthalaldehyde, isophthalaldehyde, telephthalaldehyde, naphthalenedicarboaldehyde, anthracenedicarboaldehyde, pyrenedicarboaldehyde, and the like.

In addition to the above-mentioned aldehyde compounds, an aldehyde compound having plural formyl groups such as cyclohexanedialdehyde, norbornanedialdehyde, etc., may be used. By using these aldehyde compounds, polymers in which plural monomers are combined together with the aldehyde compounds by the condensation reaction of plural formyl groups and aromatic rings can be obtained.

As specific examples of the aldehyde compound represented by the above formula (3), aldehyde compounds sown by the following structural formula may be exemplified.

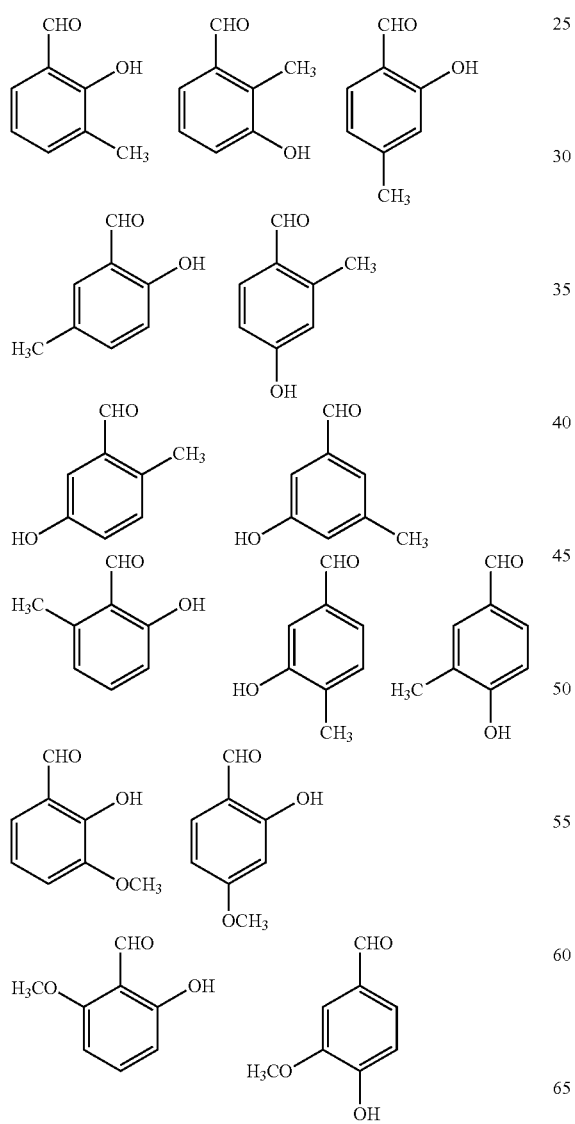

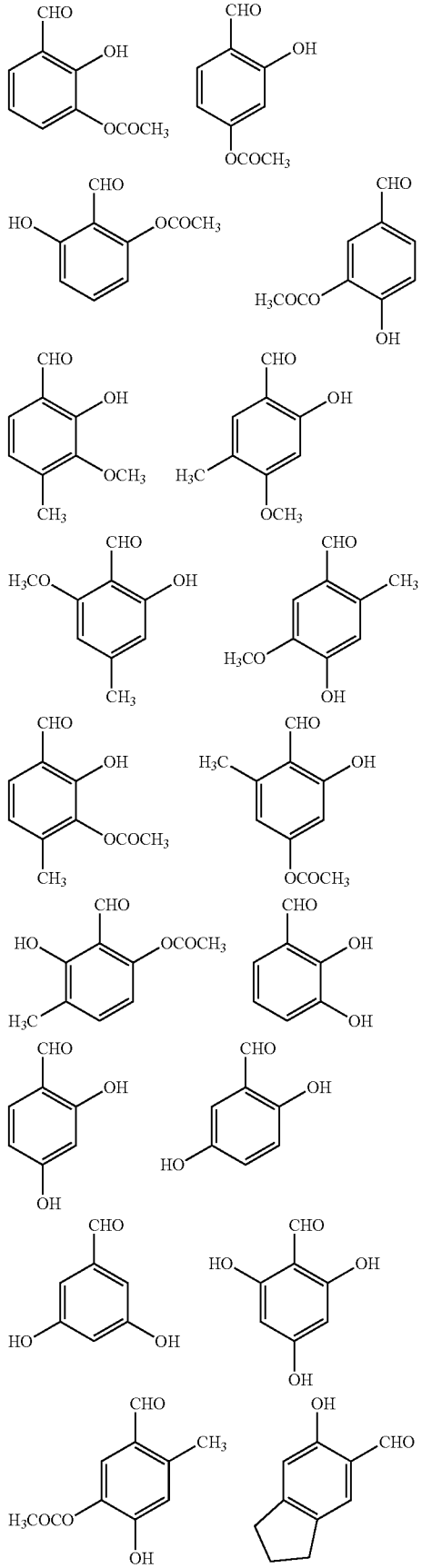

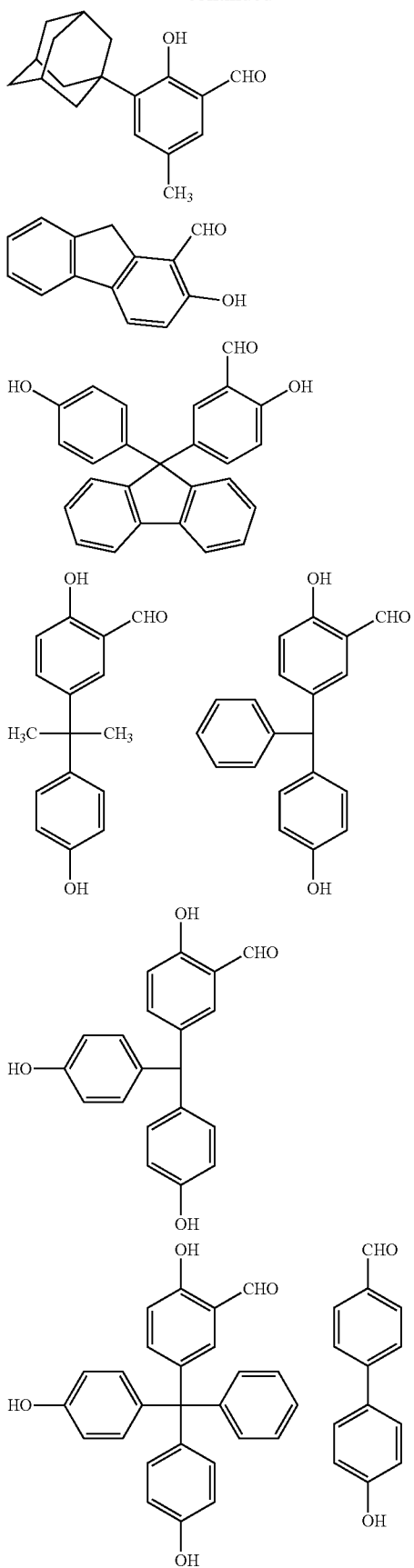
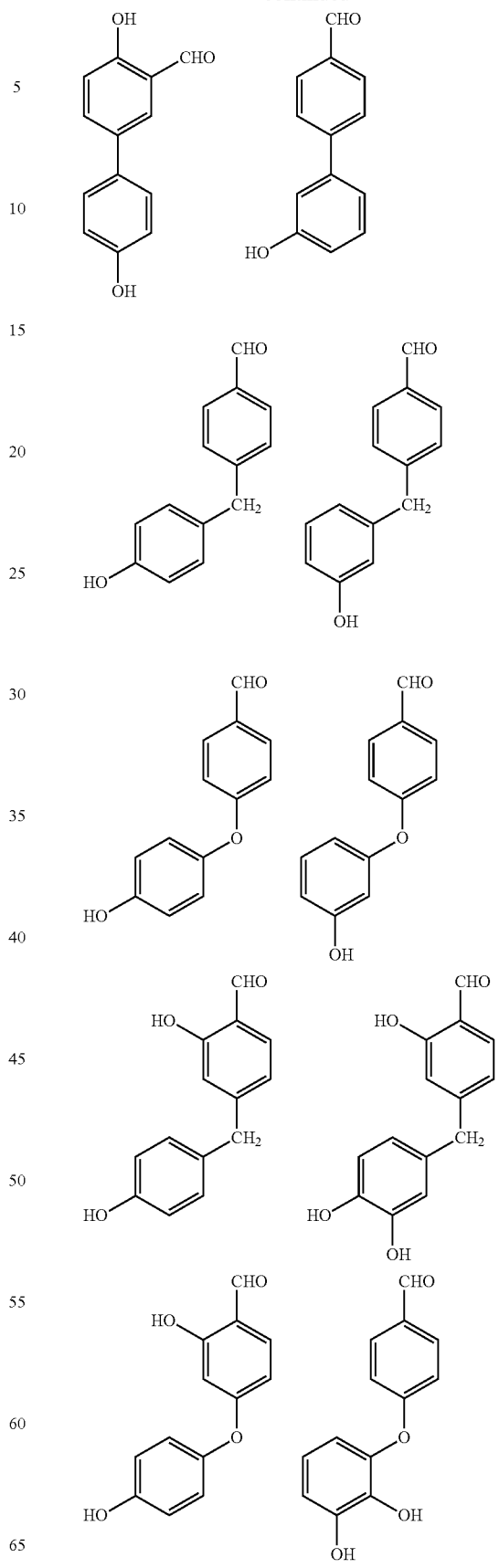

27
-continued
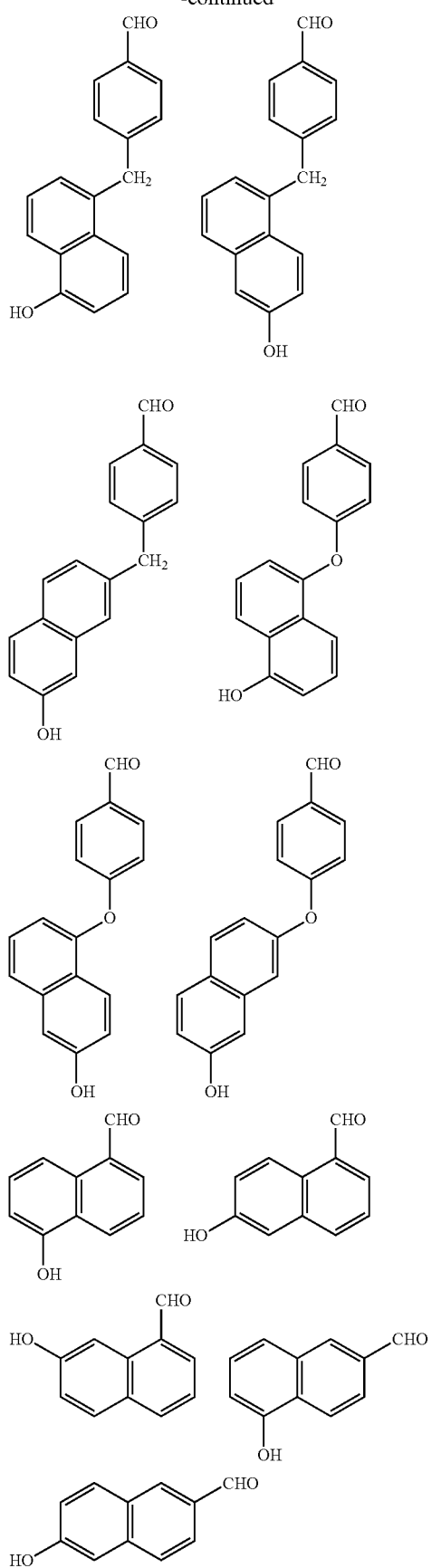
28
-continued
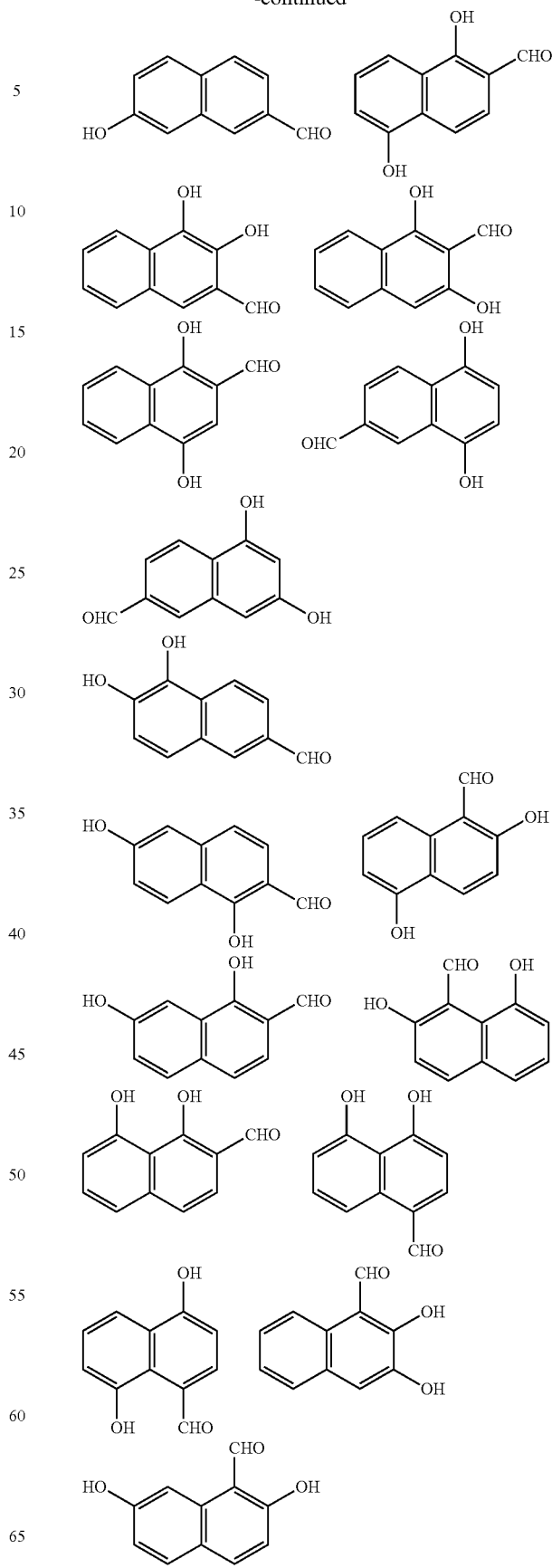

-continued

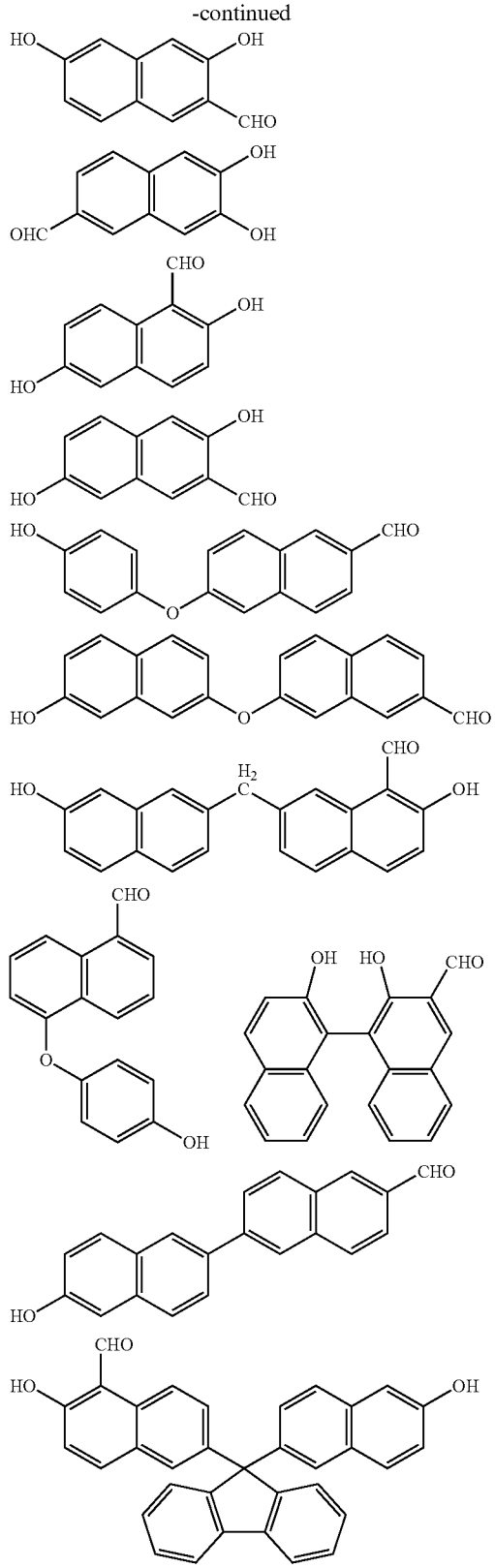

Further, an equivalent body of the aldehyde compound shown above may also be used. For example, an equivalent body of the aldehyde compound represented by the following general formulae (3A) and (3B) can be exemplified.

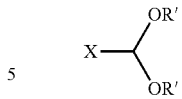

(3A)

(X is defined similarly to the foregoing X, and each R' represents an identical or a different monovalent hydrocarbon group having 10 or less carbon atoms).

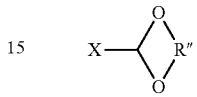

(3B)

(X is defined similarly to the foregoing X, and R" represents a divalent hydrocarbon group having 10 or less carbon atoms).

As specific examples of an equivalent body of the aldehyde compound represented by the above formula (3A), equivalent bodies of the aldehyde compound represented by the following general formulae can be exemplified, and these structures may be applied to the other aldehyde compounds similarly.

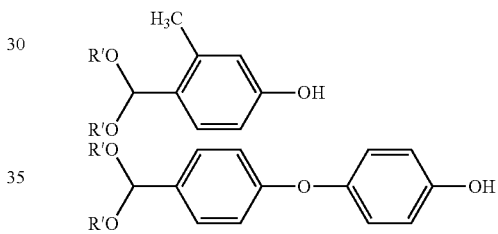

(R' is defined similarly to the foregoing R').

As specific examples of an equivalent body of the aldehyde compound represented by the above formula (3B), equivalent bodies of the aldehyde compound represented by the following general formulae can be exemplified, and these structures may be applied to the other aldehyde compounds similarly.

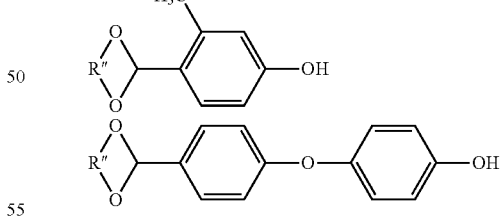

(R" is defined similarly to the foregoing R").

Ratio of an aldehyde compound to a naphthalene derivative and a benzene derivative is preferably 0.01 to 5 moles, or more preferably 0.05 to 2 moles, relative to 1 mole of the totality of the naphthalene derivative and the benzene derivative.

Polymers having a structure shown by the above formula (1) and/or (2) which consist of foregoing raw materials as a repeating unit can be produced usually by a condensation polymerization reaction of compounds corresponding to the foregoing compounds by using an acid or a base as a catalyst in a solvent or without solvent at room temperature or with cooling or heating if necessary.

Examples of the solvent to be used for the condensation polymerization reaction include alcohols such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofurane, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; lactones such as γ-butyrolactone; and non-protic polar solvents such as dimethyl sulfoxide, N,N-dimethyl formamide, and hexamethyl phosphoric triamide. These may be used singly or as a mixture of two or more of them. These solvents may be used in the range between 0 and 2,000 parts by mass relative to 100 parts by mass of raw materials of the reaction.

Examples of the acid catalyst to be used for the condensation polymerization reaction include inorganic acids such as hydrochloric acid, hydrobromic acid, sulfuric acid, nitric acid, phosphoric acid, and heteropolyacid; organic acids such as oxalic acid, trifluoroacetic acid, methane sulfonic acid, benzene sulfonic acid, p-toluene sulfonic acid, and trifluoromethane sulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium (IV) methoxide, titanium (IV) ethoxide, titanium (IV) isopropoxide, and titanium (IV) oxide.

Also, examples of the base catalyst to be used for the condensation polymerization reaction include inorganic bases such as sodium hydroxide, potassium hydroxide, barium hydroxide, sodium carbonate, sodium hydrogencarbonate, potassium carbonate, lithium hydride, sodium hydride, potassium hydride, and calcium hydride; alkyl metals such as methyl lithium, n-butyl lithium, methyl magnesium chloride, and ethyl magnesium bromide; alkoxides such as sodium methoxide, sodium ethoxide, and potassium t-butoxide; and organic bases such as triethyl amine, diisopropyl ethyl amine, N,N-dimethylaniline, pyridine, and 4-dimethylamino pyridine.

Amount thereof relative to raw materials is preferably 0.001 to 100% by mass, or more preferably 0.005 to 50% by mass. Temperature of the reaction is preferably between −50° C. and about boiling point of a solvent, or more preferably between room temperature and 100° C.

As a method for the condensation polymerization reaction, there are a method in which a naphthalene derivative, a benzene derivative, an aldehyde compound, and a catalyst are charged all at once, or a method in which a naphthalene derivative, a benzene derivative, and an aldehyde compound are gradually added in the presence of a catalyst.

After the condensation polymerization reaction, in order to remove unreacted raw materials, catalyst, and so on that are present in the reaction system, a method in which temperature of the reaction vessel is increased to 130 to 230° C. at about 1 to about 50 mmHg to remove volatile components, a method in which the polymer is fractionated by adding an appropriate solvent or water, a method in which the polymer is dissolved in a good solvent then reprecipitated in a poor solvent, and so on, can be used by selecting them depending on properties of reaction products obtained.

Polystyrene-equivalent molecular weight of the polymer thus obtained is preferably 500 to 500000, or particularly preferably 1000 to 100000, as the weight-average molecular weight (Mw). The molecular-weight distribution is preferably 1.2 to 20; but by cutting monomer components, oligomer components, or low-molecular weight polymers of a molecular weight (Mw) of 1000 or less, volatile components during baking can be suppressed so that pollution around a baking cup and surface defects due to drops of the volatile components may be avoided.

Further, into this polymer, a condensed aromatic or an alicyclic substituent group may be introduced.

Specific examples of the introducible substituent group include the following.

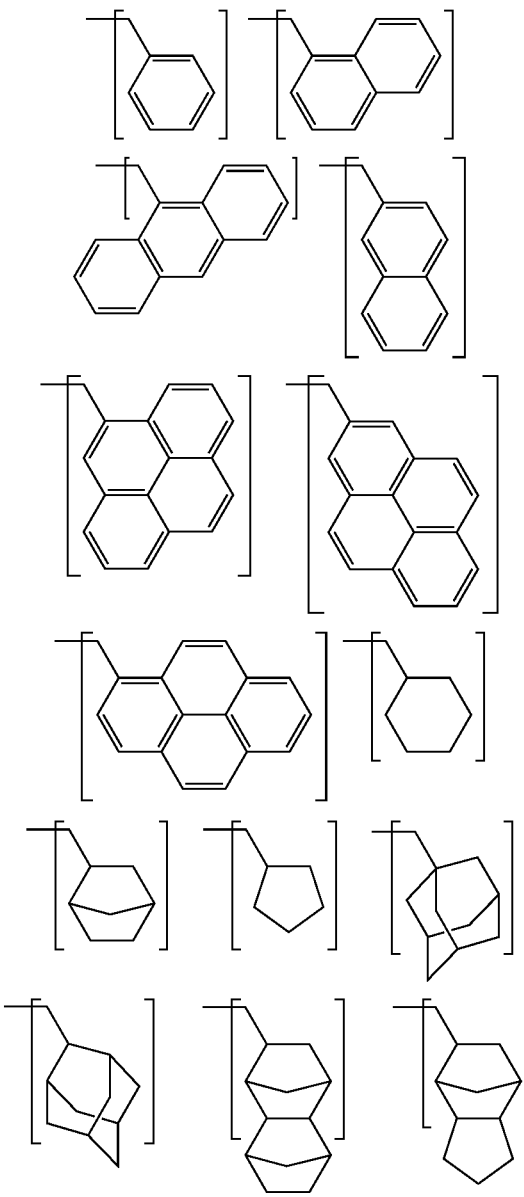

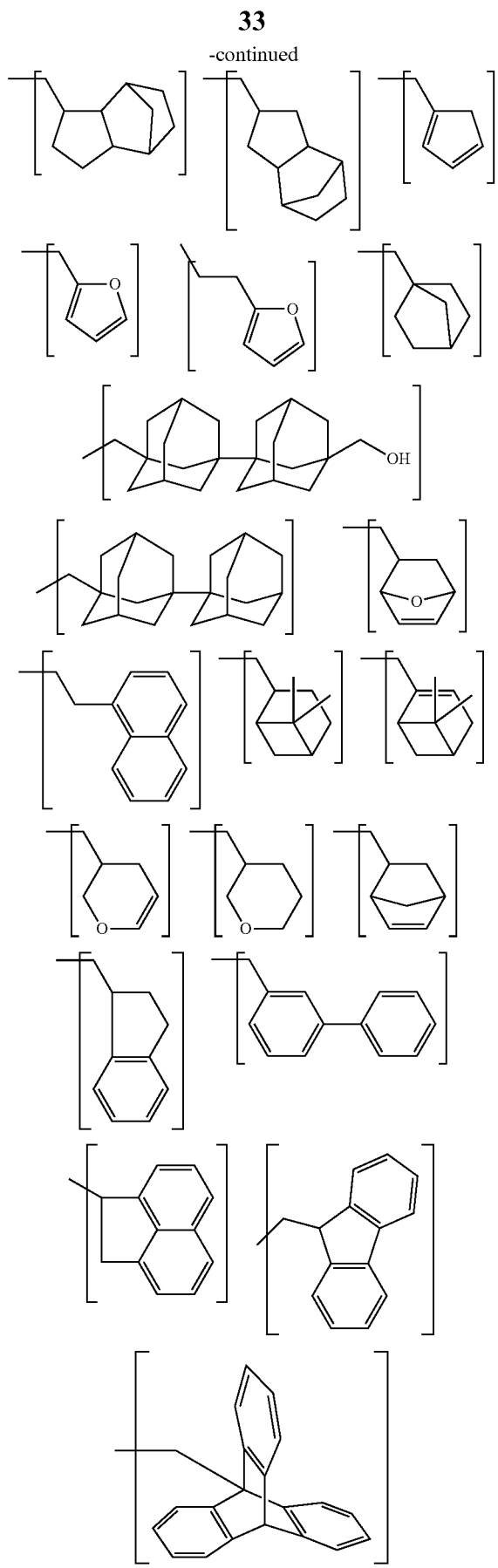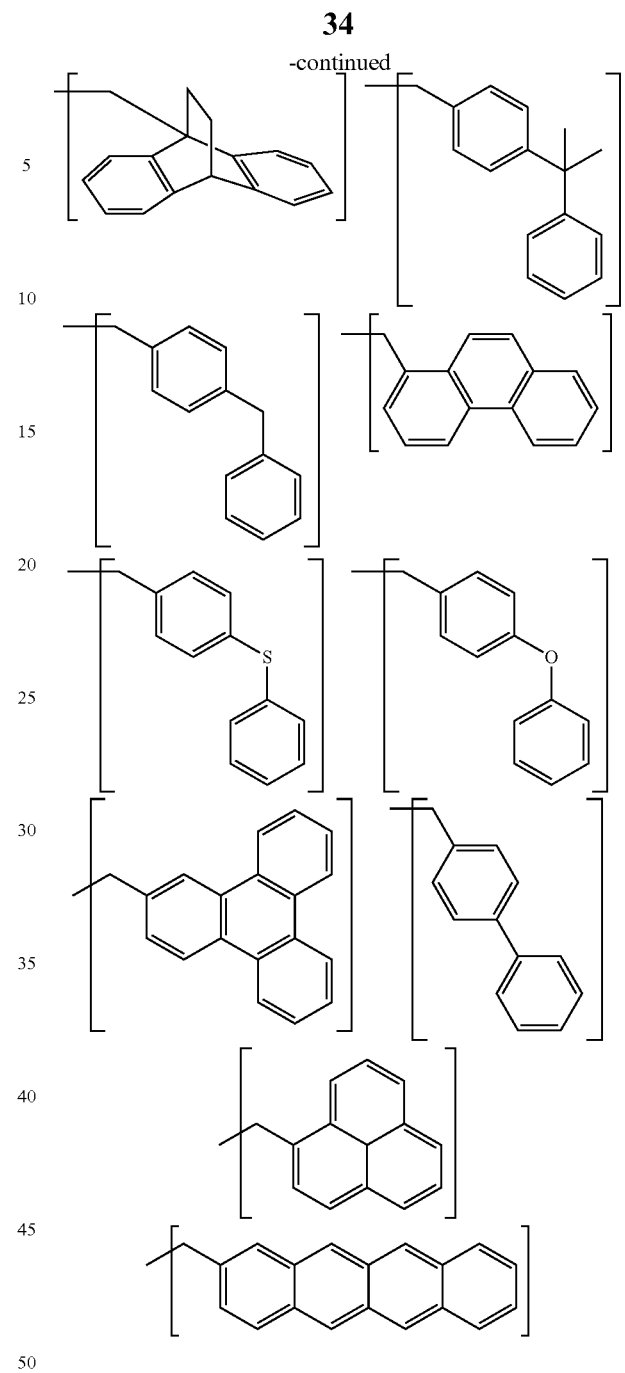

Among them, for an exposure to the light of 248 nm, a polycyclic aromatic group, such as an anthracenemethyl group and a pyrenemethyl group, is most preferably used. To improve transparency at a wavelength of 193 nm, a group having an alicyclic structure or a naphthalene structure is preferably used. On the other hand, a benzene ring has a window to improve transparency at a wavelength of 157 nm, and thus, it is preferable to improve absorbance by shifting an absorption wavelength. A furane ring has an absorption at a shorter wavelength than a benzene ring with the absorption at a wavelength of 157 nm being somewhat improved, but its effect is small. A naphthalene ring, an anthracene ring, and a pyrene ring increase the absorption due to shifting of the absorption wavelength toward a longer wavelength, and these aromatic rings have an effect to improve an etching resistance; and thus, they are preferably used.

A substituent group may be introduced by a method in which an alcohol having bonding site of a hydroxyl group in the foregoing substituent group is introduced into a polymer at an ortho-position or a para-position relative to a hydroxyl group or an alkyl group thereof in the presence of an acid catalyst in accordance with a reaction mechanism of an aromatic electrophilic substitution. Examples of the acid catalyst include hydrochloric acid, nitric acid, sulfuric acid, formic acid, oxalic acid, acetic acid, methane sulfonic acid, n-butane sulfonic acid, camphor sulfonic acid, p-toluene sulfonic acid, trifluoromethane sulfonic acid, and so on. Amount of the acid catalyst is 0.001 to 20 parts by mass, relative to 100 parts by mass of a polymer before the reaction. Amount of the introduced substituent group is in the range between 0 and 0.8 mole relative to 1 mole of a monomer unit in the polymer.

In addition, blending with another polymer may be allowed. Examples of the blending polymer include a polymer obtained from a compound represented by the naphthalene derivative or benzene derivative as a raw material while having a different composition, and a heretofore known novolak resin etc. Blending a polymer like this can improve coating properties by a spin coating method and filling properties of a non-planar substrate. In addition, a material having a higher carbon density and a higher etching resistance can be chosen.

Examples of the heretofore known novolak resin usable for blending include condensation-dehydration compounds obtained by condensation of formaldehyde and phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluorene-9-ylidene)bisphenol, 2,2'-dimethyl-4,4'-(9H-fluorene-9-ylidene)bisphenol, 2,2'-diallyl-4,4'-(9H-fluorene-9-ylidene)bisphenol, 2,2'-difluoro-4,4'-(9H-fluorene-9-ylidene)bisphenol, 2,2'-diphenyl-4,4'-(9H-fluorene-9-ylidene)bisphenol, 2,2'-dimethoxy-4,4'-(9H-fluorene-9-ylidene)bisphenol, 2,3,2'3'-tetrahydro-(1,1')-spirobiindene-6,6'-diol, 3,3,3',3'-tetramethyl-2,3,2'3'-tetrahydro-(1,1')-spirobiindene-6,6'-diol, 3,3,3',3',4,4'-hexamethyl-2,3,2'3'-tetrahydro-(1,1')-spirobiindene-6,6'-diol, 2,3,2'3'-tetrahydro-(1,1')-spirobiindene-5,5'-diol, 5,5'-dimethyl-3,3,3',3'-tetramethyl-2,3,2'3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol, dihydroxynaphthalene such as 1,5-dihydroxynaphthalene, 1,7-dihydroxynaphthalene, and 2,6-dihydroxynaphthalene, 3-hydroxy-naphthalene-2-methyl carboxylic acid, hydroxyindene, hydroxyanthracene, bisphenol, or trisphenol; polystyrene; polyvinylnaphthalene; polyvinylanthracene; polyvinylcarbazole; polyindene; polyacenaphthylene; polynorbornene; polycyclodecene; polytetracyclododecene; polynortricyclene; poly(meth)acrylate; and copolymer thereof.

Moreover, other resins such as nortricyclene copolymer, hydrogenated-naphtholnovolak resin, naphtholdicyclopentadiene copolymer, phenoldicyclopentadiene copolymer, fluorenebisphenolnovolak resin, acenaphthylene copolymer, indene copolymer, fullerene having a phenol structure, bisphenol compound and novolak resin thereof, dibisphenol compound and novolak resin thereof, novolak resin of adamantane phenol compound, hydroxyvinylnaphthalene copolymer, bisnaphthol compound and novolak resin thereof, ROMP, resin compounds such as tricyclopentadiene copolymer, and resin compounds of fullerenes can be blended.

Amount of the blending compound or of the blending polymer is preferably 0 to 1000 parts by mass, or more preferably 0 to 500 parts by mass, relative to 100 parts by mass of a total mass of the naphthalene derivative, the benzene derivative, and the aldehyde compound.

The composition for forming a resist under layer film used in the method for forming a resist under layer film of the present invention may contain a crosslinking agent. Specifically, crosslinking agents described in paragraphs (0055) to (0060) of Japanese Patent Laid-Open Application No. 2007-199653 may be added.

The composition for forming a resist under layer film used in the method for forming a resist under layer film of the present invention may contain an acid generator to further facilitate a thermal crosslinking reaction. The acid generator generates an acid by thermal decomposition or by light irradiation; and any of them may be added. Specifically, acid generators described in paragraphs (0061) to (0085) of Japanese Patent Laid-Open Application No. 2007-199653 may be added.

The composition for forming a resist under layer film used in the method for forming a resist under layer film of the present invention may contain a basic compound to improve storage stability. The basic compound plays a role of a quencher to an acid that is generated faintly from the acid generator, whereby a crosslinking reaction by the acid generated therefrom may be prevented from progressing. Specifically, basic compounds described in paragraphs (0086) to (0090) of Japanese Patent Laid-Open Application No. 2007-199653 may be added.

An organic solvent usable in the composition for forming a resist under layer film used in the method for forming a resist under layer film of the present invention is not particularly limited, provided that the organic solvent can dissolve the base polymer, the acid generator, the crosslinking agent, and other additives, as described before. Specifically, solvents described in paragraphs (0091) to (0092) of Japanese Patent Laid-Open Application No. 2007-199653 may be added.

The composition for forming a resist under layer film used in the method for forming a resist under layer film of the present invention may contain a surfactant to improve spreadability in spin coating. Specifically, surfactants described in paragraphs (0165) to (0166) of Japanese Patent Laid-Open Application No. 2008-111103 may be added.

Thus, above-mentioned materials can be used in the composition for forming a resist under layer film used in the method for forming a resist under layer film of the present invention, and by using these materials, a resist under layer film having excellent etching resistance properties can be obtained.

The patterning process using the method for forming a resist under layer film of the present invention may be exemplified as followings.

The present invention provides a patterning process to form a pattern on a substrate to be processed, wherein a resist under layer film is formed on a substrate to be processed by using the method for forming a resist under layer film of the present invention, a silicon-containing resist intermediate film is formed on the resist under layer film by using a composition for forming the silicon-containing resist intermediate film, a resist upper layer film is formed on the silicon-containing resist intermediate film by using a composition for forming the resist upper layer film, a circuit pattern is formed with the resist upper layer film, the silicon-containing resist intermediate film is etched by using the resist upper layer film having the formed pattern as a mask, the resist under layer film is etched by using the silicon-containing resist intermediate film having the formed pattern as a mask, and then the substrate to be processed is etched by using the resist under layer film having the formed pattern as a mask to form the pattern on the substrate to be processed.

Thickness of the resist under layer film formed by the above-mentioned method can be arbitrarily selected, though the range thereof is preferably 30 to 20000 nm, or more preferably 50 to 15000 nm. In the case of the tri-layer process, after forming the resist under layer film, a silicon-containing resist intermediate film and a resist upper layer film not containing a silicon atom (mono-layer resist film) may be formed thereonto.

As to the silicon-containing resist intermediate film in the tri-layer process as mentioned above, an intermediate film based on polysiloxane is preferably used. When this silicon-containing resist intermediate film is made to have an effect of an antireflective film, reflection can be suppressed. Specifically, materials including polysiloxanes described in Japanese Patent Laid-Open Publication No. 2004-310019, No. 2007-302873, No. 2009-126940, and so on, can be mentioned. When a resist under layer film using a composition containing many aromatic groups and having a high etching resistance to a substrate is used, especially for photo-exposure to the light of 193 nm wavelength, the k-value and the substrate reflectance become high; but the substrate reflectance can be reduced to 0.5% or less by suppressing reflection by the resist intermediate film.

In the patterning process of the present invention, an inorganic hard mask intermediate film can be formed on the resist under layer film instead of the above-mentioned silicon-containing resist intermediate film. In the case of forming the inorganic hard mask intermediate film, a silicon oxide film, a silicon nitride film, a silicon oxynitride film (SiON film), or an amorphous silicon film is formed by a CVD method, an ALD method, or the like. A method for forming a silicon nitride film is described in Japanese Patent Laid-Open Publication No. 2002-334869, International Patent Laid-Open Publication No. 2004/066377, and so on. Thickness of the inorganic hard mask intermediate film is 5 to 200 nm, or preferably 10 to 100 nm; among the foregoing films, a SiON film, which is highly effective as an antireflective film, is most preferably used. Because temperature of a substrate during the time of forming a SiON film is 300 to 500° C., the under layer film needs to be endurable the temperature of 300 to 500° C. The composition for forming a resist under layer film used in the present invention has a high heat resistance so that it is endurable the high temperature of 300 to 500° C.; and thus, the inorganic hard mask intermediate film formed by a CVD method or an ALD method and the resist under layer film formed by a spin coating method can be combined.

Also, the present invention provides a patterning process to form a pattern on a substrate to be processed, wherein a resist under layer film is formed on a substrate to be processed by using the method for forming a resist under layer film of the present invention, a titanium-containing resist intermediate film is formed on the resist under layer film by using a composition for forming the titanium-containing resist intermediate film, a resist upper layer film is formed on the titanium-containing resist intermediate film by using a composition for forming the resist upper layer film, a circuit pattern is formed with the resist upper layer film, the titanium-containing resist intermediate film is etched by using the resist upper layer film having the formed pattern as a mask, the resist under layer film is etched by using the titanium-containing resist intermediate film having the formed pattern as a mask, and then an etching residue of the titanium-containing resist intermediate film is cleaned and removed with a cleaning liquid containing hydrogen peroxide.

The composition for forming a titanium-containing resist intermediate film preferably contains a titanium-containing compound obtained by hydrolysis and/or condensation of one or more kinds of titanium compounds shown by the following general formula.

$$Ti(OR^8)_4$$

($R^8$ represents an organic group having 1 to 30 carbon atoms).

As the titanium-containing compound represented by the above general formula, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxybisethylacetoacetate, titanium dibutoxybis-ethylacetoacetate, titanium dipropoxy-bis-2,4-pentanedionate, titanium dibutoxy-bis-2,4-pentanedionate, or oligomers as partially hydrolysis condensates thereof etc., may be exemplified.

When the etching residue of the titanium-containing resist intermediate film is cleaned, the etching residue of the titanium-containing resist intermediate film can be removed without damaging to a layer to be processed of a substrate to be processed, using a cleaning liquid containing hydrogen peroxide. Accordingly, the titanium-containing resist intermediate film can preferably be used in a finer processing process such as a double patterning process.

A resist upper layer film may be formed on these resist intermediate film; but also an organic antireflective film (BARC) may be formed on the resist intermediate film by spin coating, followed by formation of a resist upper layer film thereonto. In the case that the SiON film is used as the resist intermediate film, reflection can be suppressed even in an immersion exposure with a high NA of beyond 1.0 due to a bi-layer antireflective film of the SiON film and BARC. Further, a footing profile of the resist upper layer film pattern immediately above the SiON film can be suppressed by forming BARC.

The resist upper layer film in the multi-layer resist method may be any of a positive-type and a negative-type, wherein the same composition as a generally used composition for forming resist upper layer (e.g. photoresist composition) may be used. In the case that the resist upper layer film is formed by the foregoing composition for forming resist upper layer, a spin coating method is preferably used, similarly to the case of forming the resist under layer film. After spin coating of the composition for forming resist upper layer, prebaking is carried out, preferably in the temperature range between 60 and 180° C. for 10 to 300 seconds. Thereafter, exposure, post-exposure bake (PEB), and development are carried out according to respective conventional methods to obtain a resist upper layer film pattern. Meanwhile, thickness of the resist upper layer film is not particularly limited, though the thickness is preferably 30 to 500 nm, or more preferably 50 to 400 nm.

In the patterning process of the present invention, the resist upper layer film can be patterned by any of the method of photolithography with a high energy beam having a wavelength of 300 nm or less, the method of a direct drawing with an electron beam, the nano-imprinting method, or a combination of these methods.

Specific examples of the high energy beam having a wavelength of 300 nm or less include a far UV beam, a KrF excimer laser beam (248 nm), an ArF excimer laser beam (193 nm), a $F_2$ laser beam (157 nm), a $Kr_2$ laser beam (146 nm), an $Ar_2$ laser beam (126 nm), a soft X-ray (EUV, 13.5 nm), an electron beam (EB), and a X-ray.

In the patterning process of the present invention, the resist upper layer film can be patterned by alkaline development or a development by an organic solvent.

Then, etching is carried out by using the obtained resist upper layer film pattern as a mask. Etching of the resist intermediate film in the tri-layer process, especially etching of the inorganic hard mask intermediate film is carried out by using a fluorocarbon gas and using a resist upper layer film pattern as a mask. Then, etching of the resist under layer film is carried out by using an oxygen gas or a hydrogen gas and a resist intermediate film pattern, especially an inorganic hard mask intermediate film pattern as a mask.

Subsequent etching of the substrate to be processed may be carried out also by a conventional method; for example, etching is carried out by using a gas mainly consists of a fluorocarbon gas in the case of the substrate being $SiO_2$, SiN, or a silica-type low-dielectric insulating film, while, in the case of p-Si, Al, or W, etching is carried out by a gas mainly consists of a chlorine-type gas or a bromine-type gas. In the case that processing of the substrate is carried out by etching with a fluorocarbon gas, the silicon-containing resist intermediate film in the tri-layer process can be removed at the same time as processing of the substrate. In the case that etching of the substrate is carried out by a chlorine-type gas or a bromine-type gas, removal of the silicon-containing resist intermediate film is preferably carried out separately after processing of the substrate by dry etching with a fluorocarbon gas.

The resist under layer film formed by using the method for forming a resist under layer film of the present invention has a characteristic of excellent etching resistance to these substrates to be processed.

Meanwhile, as to the substrate to be processed, the one such as those having, on a semiconductor substrate, any of the following films (hereinafter, "layer to be processed")—a metal film, a metal carbide film, a metal oxide film, a metal nitride film, and a metal oxynitride film—may be used, wherein the metal thereof includes, for example, silicon, titanium, tungsten, hafnium, zirconium, chromium, germanium, copper, aluminum, indium, gallium, arsenic, palladium, iron, tantalum, iridium, molybdenum or an alloy of these metals.

The substrate is not limited and may be Si, an amorphous silicon (α-Si), p-Si, $SiO_2$, SiN, SiON, W, TiN, Al, or the like. The substrate may be a material different from the layer to be processed may be used.

The layer to be processed may be made of Si, $SiO_2$, SiON, SiN, p-Si, α-Si, W, W—Si, Al, Cu, Al—Si, or the like; various low dielectric constant (low-k) films, or etching stopper films. Typically, the layer may be formed at a thickness of 50 to 10000 nm, in particular at a thickness of 100 to 5000 nm.

Thus, if the method for forming a resist under layer film of the present invention is used, since unevenness on a substrate to be processed can be flattened, change in thickness of a resist intermediate film and a resist upper layer film is reduced, thereby a fine pattern can be formed to the substrate to be processed with high precision.

EXAMPLES

In the following, the present invention is described specifically by referring to Synthesis Examples, Examples, and Comparative Examples, but the present invention is not limited by the following Examples.

The molecular weight was measured by the following method. The weight average molecular weight (Mw) and the number average molecular weight (Mn) in terms of polystyrene were calculated by gel permeation chromatography (GPC) using tetrahydrofuran as an eluent to determine the degree of dispersion (Mw/Mn).

Synthesis Example

Synthesis Example 1

291 g of fluorenebisnaphthol (0.65 mol) as a compound (I), 75 g of 37% formalin aqueous solution (0.93 mol) as a compound (II) and 5 g of oxalic acid were added to a 300 ml flask and agitated to be reacted at 100° C. for 24 hours. After the reaction, the product was dissolved in 500 ml of methyl isobutyl ketone, and a catalyst and metal impurities were removed with sufficient water cleaning. A solvent was removed under reduced pressure, and the pressure was further reduced to 2 mmHg at 150° C. to remove moisture and an unreacted monomer, thereby obtaining a polymer 1 having the following structural formula as a repeating unit. The molecular weight (Mw) and the degree of dispersion (Mw/Mn) were calculated by GPC.

Molecular weight (Mw): 3,500

Degree of dispersion (Mw/Mn)=4.50

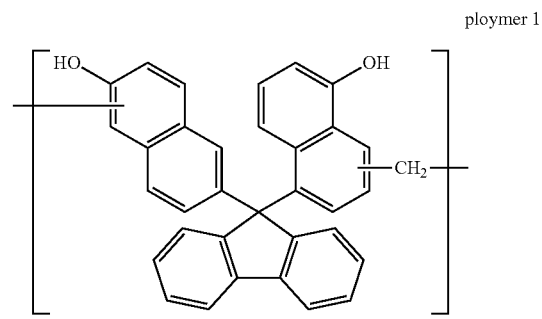

ploymer 1

Synthesis Example 2

200 g of fluorenebisphenol (0.57 mol) as a compound (I), 75 g of 37% formalin aqueous solution (0.93 mol) as a compound (II) and 5 g of oxalic acid were added to a 300 ml flask and agitated to be reacted at 100° C. for 24 hours. After the reaction, the product was dissolved in 500 ml of methyl isobutyl ketone, and a catalyst and metal impurities were removed with sufficient water cleaning. A solvent was removed under reduced pressure, and the pressure was further reduced to 2 mmHg at 150° C. to remove moisture and an unreacted monomer, thereby obtaining a polymer 2 having the following structural formula as a repeating unit. The molecular weight (Mw) and the degree of dispersion (Mw/Mn) were calculated by GPC.

Molecular weight (Mw): 6,500

Degree of dispersion (Mw/Mn)=5.20

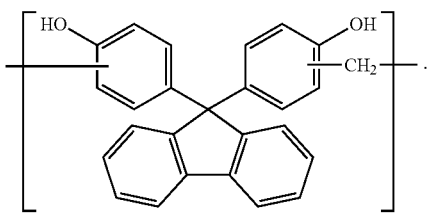

polymer 2

Synthesis Example 3

80 g of 1,5-dihydroxynaphthalene (0.50 mol) as a compound (I), 51.6 g of 2-hydroxy-6-naphthaldehyde (0.30 mol) as a compound (II) and 145 g of methyl cellosolve were added to a 1,000 ml flask and agitated at 70° C. and 20 g of 20 wt % paratoluene sulfonic acid methyl cellosolve solution was added thereto. After the temperature of the product was raised to 85° C. and agitated for 6 hours, it was cooled at room temperature and diluted with 800 ml of ethyl acetate. The product was transferred to a separatory funnel and repeatedly cleaned with 200 ml of deionized water to remove a reaction catalyst and metal impurities. After a solution obtained was concentrated under reduced pressure, 600 ml of ethyl acetate was added to a residue to precipitate a polymer with 2,400 ml of hexane. The polymer precipitated was filtered and collected and dried under reduced pressure to obtain a polymer 3 having the following structural formula as a repeating unit. The molecular weight (Mw) and the degree of dispersion (Mw/Mn) were calculated by GPC.

Molecular weight (Mw): 3,200
Degree of dispersion (Mw/Mn)=2.44

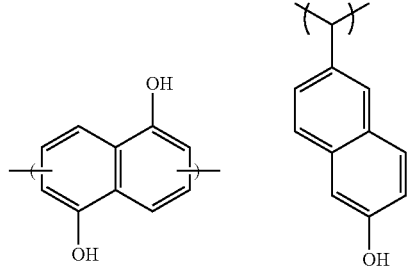

polymer 3

Synthesis Examples 4 and 5

Using each compound shown in the following Table 1 and the same reaction conditions as Synthesis Example 2 except therefor, a reaction was produced to obtain polymers 4 and 5 as shown in the following Table 2.

TABLE 1

| Synthesis Example | Compound (I) | Compound (II) |
|---|---|---|
| 1 | HO—[naphthyl-fluorene-naphthyl]—OH (291 g) | 37% formalin aqueous solution (75 g) |
| 2 | HO—[phenyl-fluorene-phenyl]—OH (200 g) | 37% formalin aqueous solution (75 g) |
| 3 | 1,5-dihydroxynaphthalene (80 g) | 2-hydroxy-6-naphthaldehyde-CHO (51.6 g) |

TABLE 1-continued

| Synthesis Example | Compound (I) | Compound (II) |
|---|---|---|
| 4 | 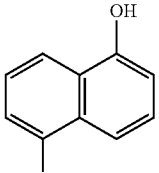 OH (80 g) | Paraformaldehyde (9.0 g) |
| 5 | 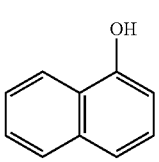 [SMILES: Oc1cccc2ccccc12] OH (72 g) | 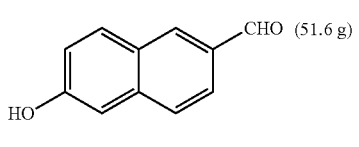 CHO (51.6 g) |

The following Table 2 shows the structural formula, the molecular weight (Mw) and the degree of dispersion (Mw/Mn) of each polymer obtained in Synthesis Examples 1 to 5.

TABLE 2

| Synthesis Example | | Desired product | Molecular weight (Mw) | Degree of Dispersion (Mw/Mn) |
|---|---|---|---|---|
| 1 | Polymer 1 | 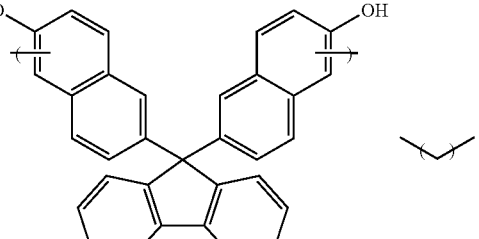 | 3500 | 4.50 |
| 2 | Polymer 2 | 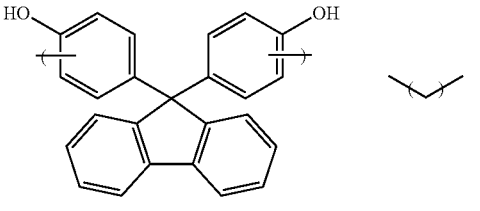 | 6500 | 5.20 |
| 3 | Polymer 3 | 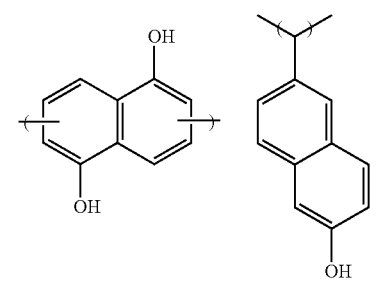 | 3200 | 2.44 |
| 4 | Polymer 4 | 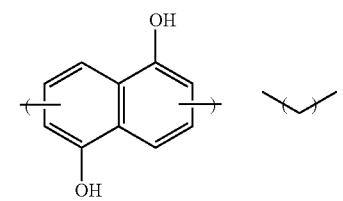 | 1500 | 2.20 |

TABLE 2-continued

| Synthesis Example | | Desired product | Molecular weight (Mw) | Degree of Dispersion (Mw/Mn) |
|---|---|---|---|---|
| 5 | Polymer 5 | (structure shown) | 2700 | 2.61 |

[Preparation of a Composition for Forming a Resist Under Layer Film]

10 parts by mass of the above polymers 1 to 5 was dissolved in 100 parts by mass of propylene glycol monomethyl ether acetate (PGMEA) containing 0.1% by mass of FC-430 (Sumitomo 3M Limited) and filtrated with a 0.1 μm filter made of a fluorocarbon resin to each prepare a solution for forming a resist under layer film (SOL-1 to 5).

Example

SOL-1 to 5 were applied on a silicon substrate on which an uneven shape (0.1 μm in height and 10 μm in width) was formed with silicon dioxide, and baked at 250° C. for 60 seconds in a nitrogen atmosphere whose oxygen concentration was 5% (flattening process). Next, the product was baked at 350° C. for 60 seconds in the air (whose oxygen concentration was 21%) to obtain a hardened film (crosslinking hardening process).

Comparative Example

SOL-1 to 5 were applied on a silicon substrate on which an uneven shape (0.1 μm in height and 10 μm in width) was formed with silicon dioxide, and baked at 350° C. for 60 seconds in the air (whose oxygen concentration was 21%) to obtain a hardened film.

Each silicon substrate obtained was cut and the following Table 3 and FIGS. 1 to 10 show the results of SEM data. In order to examine the extent of a flattened level, Δt value was measured. As shown in FIG. 11, the Δt value is a difference between the height of a line portion and the height of a space portion. The height of the space portion was measured 0.6 μm from the step.

TABLE 3

Figure 2:
FIG. 2 is a SEM cross-sectional photograph showing a cut substrate obtained by applying SOL-2 on a substrate and heat-treating the same in two steps as an E.
Figure 3:
FIG. 3 is a SEM cross-sectional photograph showing a cut substrate obtained by applying SOL-3 on a substrate and heat-treating the same in two steps as an Example.
Figure 4:
FIG. 4 is a SEM cross-sectional photograph showing a cut substrate obtained by applying SOL-4 on a substrate and heat-treating the same in two steps as an Example.
Figure 5:
FIG. 5 is a SEM cross-sectional photograph showing a cut substrate obtained by applying SOL-5 on a substrate and heat-treating the same in two steps as an Example.
Figure 6:
FIG. 6 is a SEM cross-sectional photograph showing a cut substrate obtained by applying SOL-1 on a substrate and heat-treating the same in one step as a Comparative Example.
Figure 7:
FIG. 7 is a SEM cross-sectional photograph showing a cut substrate obtained by applying SOL-2 on a substrate and heat-treating the same in one step as a Comparative Example.
Figure 8:
FIG. 8 is a SEM cross-sectional photograph showing a cut substrate obtained by applying SOL-3 on a substrate and heat-treating the same in one step as a Comparative Example.
Figure 9:
FIG. 9 is a SEM cross-sectional photograph showing a cut substrate, obtained by applying SOL-4 on a substrate and heat-treating the same in one step as a Comparative Example.
Figure 10:
FIG. 10 is a SEM cross-sectional photograph showing a cut substrate obtained by applying SOL-5 on a substrate and heat-treating the same in one step as a Comparative Example.
Figure 11:
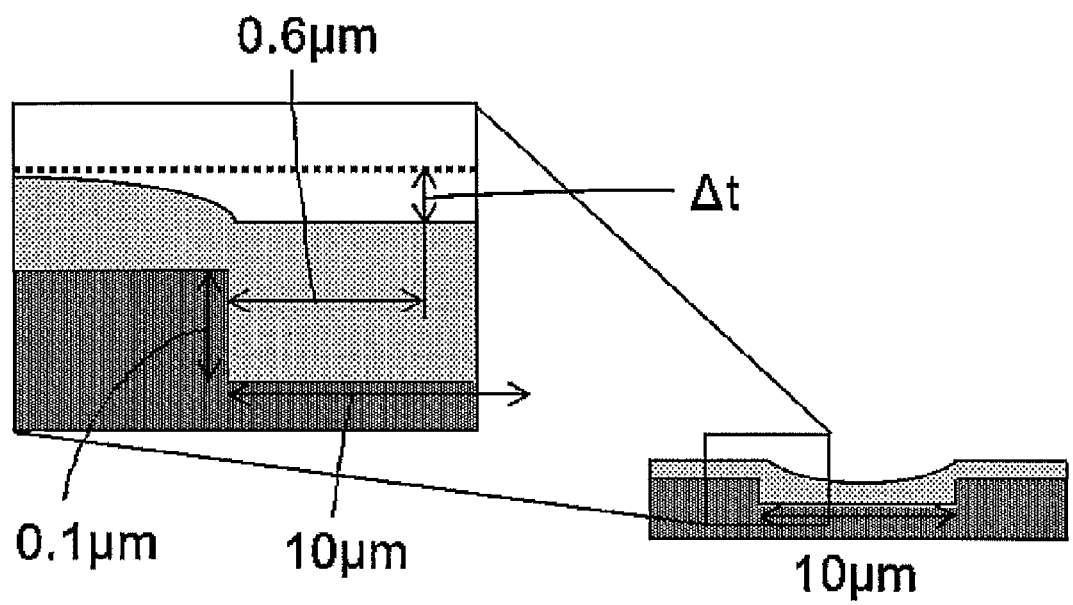
FIG. 11 is a drawing to explain a method for evaluating flattening characteristics in Examples of the present invention.

| | Example | | Comparative Example | |
|---|---|---|---|---|
| | Cross-sectional photograph | Δt (nm) | Cross-sectional photograph | Δt (nm) |
| SOL-1 | FIG. 1 | 20 | FIG. 6 | 40 |
| SOL-2 | FIG. 2 | 20 | FIG. 7 | 55 |
| SOL-3 | FIG. 3 | 20 | FIG. 8 | 50 |
| SOL-4 | FIG. 4 | 15 | FIG. 9 | 50 |
| SOL-5 | FIG. 5 | 10 | FIG. 10 | 45 |

As shown in Table 3, Examples 1 to 5 in which heat-treatment was conducted in two steps show the Δt value of 10 to 20 and a flattened substrate. Also, cross-sectional photographs of a substrate (FIGS. 1 to 5) show that there is a film filling while leaving no space. Meanwhile, Comparative Examples 1 to 5 in which heat-treatment was conducted in once step shows the Δt value of 40 to 55 and no flattened substrate.

It was found that by using the method for forming a resist under layer film of the present invention, a resist under layer film having excellent filling/flattening properties can be obtained so that unevenness on a substrate can be flattened.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A method for forming a resist under layer film used in a lithography process, comprising:
    a process for applying a composition for forming a resist under layer film containing an organic compound having an aromatic unit on a substrate; and
    a process for heat-treating the applied resist under layer film in an atmosphere whose oxygen concentration is 10% or more at 150° C. to 600° C. for 10 to 600 seconds after heat-treating the same in an atmosphere whose oxygen concentration is less than 10% at 50 to 350° C.

2. The method for forming a resist under layer film according to claim 1, wherein the organic compound having an aromatic unit has a structure shown by the following general formula (1) and/or a structure shown by the following general formula (2) as a repeating unit,

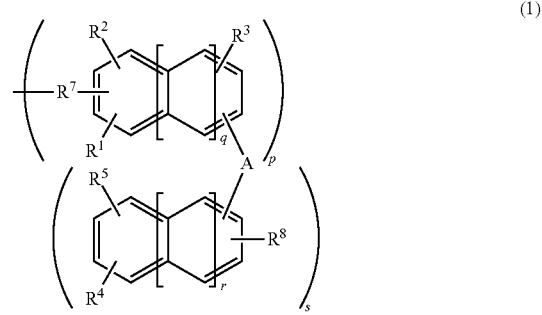

(1)

-continued

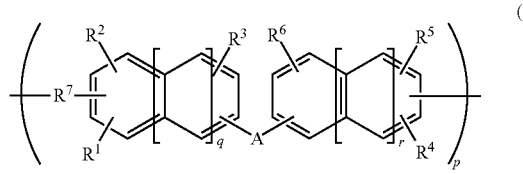

(2)

wherein:
- $R^1$, $R^2$, $R^3$, $R^4$, $R^5$, and $R^6$ represent mutually identical or different hydrogen atoms, hydroxyl groups, or monovalent organic groups having 1 to 20 carbon atoms;
- $R^7$ represents a single bond or a divalent organic group having 1 to 20 carbon atoms;
- "A" represents a single bond or a divalent organic group having 1 to 30 carbon atoms;
- "q" and "r" represent 0, 1, or 2;
- "s" represents 0 or 1; and
- "p" represents an optional natural number so that the weight average molecular weight is 100,000 or less.

3. A patterning process to form a pattern on a substrate to be processed, wherein a resist under layer film is formed on a substrate to be processed by using the method for forming a resist under layer film according to claim 1, a silicon-containing resist intermediate film is formed on the resist under layer film by using a composition for forming the silicon-containing resist intermediate film, a resist upper layer film is formed on the silicon-containing resist intermediate film by using a composition for forming the resist upper layer film, a circuit pattern is formed with the resist upper layer film, the silicon-containing resist intermediate film is etched by using the resist upper layer film having the formed pattern as a mask, the resist under layer film is etched by using the silicon-containing resist intermediate film having the formed pattern as a mask, and then the substrate to be processed is etched by using the resist under layer film having the formed pattern as a mask to form the pattern on the substrate to be processed.

4. A patterning process to form a pattern on a substrate to be processed, wherein a resist under layer film is formed on a substrate to be processed by using the method for forming a resist under layer film according to claim 2, a silicon-containing resist intermediate film is formed on the resist under layer film by using a composition for forming the silicon-containing resist intermediate film, a resist upper layer film is formed on the silicon-containing resist intermediate film by using a composition for forming the resist upper layer film, a circuit pattern is formed with the resist upper layer film, the silicon-containing resist intermediate film is etched by using the resist upper layer film having the formed pattern as a mask, the resist under layer film is etched by using the silicon-containing resist intermediate film having the formed pattern as a mask, and then the substrate to be processed is etched by using the resist under layer film having the formed pattern as a mask to form the pattern on the substrate to be processed.

5. A patterning process to form a pattern on a substrate to be processed, wherein a resist under layer film is formed on a substrate to be processed by using the method for forming a resist under layer film according to claim 1, a silicon-containing resist intermediate film is formed on the resist under layer film by using a composition for forming the silicon-containing resist intermediate film, an organic antireflection film is formed on the silicon-containing resist intermediate film, a resist upper layer film is formed on the organic antireflection film by using a composition for forming the resist upper layer film to provide a four-layer resist film, a circuit pattern is formed with the resist upper layer film, the organic antireflection film and the silicon-containing resist intermediate film are etched by using the resist upper layer film having the formed pattern as a mask, the resist under layer film is etched by using the silicon-containing resist intermediate film having the formed pattern as a mask, and then the substrate to be processed is etched by using the resist under layer film having the formed pattern as a mask to form the pattern on the substrate to be processed.

6. A patterning process to form a pattern on a substrate to be processed, wherein a resist under layer film is formed on a substrate to be processed by using the method for forming a resist under layer film according to claim 2, a silicon-containing resist intermediate film is formed on the resist under layer film by using a composition for forming the silicon-containing resist intermediate film, an organic antireflection film is formed on the silicon-containing resist intermediate film, a resist upper layer film is formed on the organic antireflection film by using a composition for forming the resist upper layer film to provide a four-layer resist film, a circuit pattern is formed with the resist upper layer film, the organic antireflection film and the silicon-containing resist intermediate film are etched by using the resist upper layer film having the formed pattern as a mask, the resist under layer film is etched by using the silicon-containing resist intermediate film having the formed pattern as a mask, and then the substrate to be processed is etched by using the resist under layer film having the formed pattern as a mask to form the pattern on the substrate to be processed.

7. A patterning process to form a pattern on a substrate to be processed, wherein a resist under layer film is formed on a substrate to be processed by using the method for forming a resist under layer film according to claim 1, a titanium-containing resist intermediate film is formed on the resist under layer film by using a composition for forming the titanium-containing resist intermediate film, a resist upper layer film is formed on the titanium-containing resist intermediate film by using a composition for forming the resist upper layer film, a circuit pattern is formed with the resist upper layer film, the titanium-containing resist intermediate film is etched by using the resist upper layer film having the formed pattern as a mask, the resist under layer film is etched by using the titanium-containing resist intermediate film having the formed pattern as a mask, and then an etching residue of the titanium-containing resist intermediate film is cleaned and removed with a cleaning liquid containing hydrogen peroxide.

8. A patterning process to form a pattern on a substrate to be processed, wherein a resist under layer film is formed on a substrate to be processed by using the method for forming a resist under layer film according to claim 2, a titanium-containing resist intermediate film is formed on the resist under layer film by using a composition for forming the titanium-containing resist intermediate film, a resist upper layer film is formed on the titanium-containing resist intermediate film by using a composition for forming the resist upper layer film, a circuit pattern is formed with the resist upper layer film, the titanium-containing resist intermediate film is etched by using the resist upper layer film having the formed pattern as a mask, the resist under layer film is etched by using the titanium-containing resist intermediate film having the formed pattern as a mask, and then an etching residue of the titanium-containing resist intermediate film is cleaned and removed with a cleaning liquid containing hydrogen peroxide.

9. A patterning process to form a pattern on a substrate to be processed, wherein a resist under layer film is formed on a substrate to be processed by using the method for forming a resist under layer film according to claim 1, a titanium-containing resist intermediate film is formed on the resist under layer film by using a composition for forming the titanium-containing resist intermediate film, an organic antireflection film is formed on the titanium-containing resist intermediate film, a resist upper layer film is formed on the organic antireflection film by using a composition for forming the resist upper layer film to provide a four-layer resist film, a circuit pattern is formed with the resist upper layer film, the organic antireflection film and the titanium-containing resist intermediate film are etched by using the resist upper layer film having the formed pattern as a mask, the resist under layer film is etched by using the titanium-containing resist intermediate film having the formed pattern as a mask, and then an etching residue of the titanium-containing resist intermediate film is cleaned and removed with a cleaning liquid containing hydrogen peroxide.

10. A patterning process to form a pattern on a substrate to be processed, wherein a resist under layer film is formed on a substrate to be processed by using the method for forming a resist under layer film according to claim 2, a titanium-containing resist intermediate film is formed on the resist under layer film by using a composition for forming the titanium-containing resist intermediate film, an organic antireflection film is formed on the titanium-containing resist intermediate film, a resist upper layer film is formed on the organic antireflection film by using a composition for forming the resist upper layer film to provide a four-layer resist film, a circuit pattern is formed with the resist upper layer film, the organic antireflection film and the titanium-containing resist intermediate film are etched by using the resist upper layer film having the formed pattern as a mask, the resist under layer film is etched by using the titanium-containing resist intermediate film having the formed pattern as a mask, and then an etching residue of the titanium-containing resist intermediate film is cleaned and removed with a cleaning liquid containing hydrogen peroxide.

11. A patterning process to form a pattern on a substrate to be processed, wherein a resist under layer film is formed on a substrate to be processed by using the method for forming a resist under layer film according to claim 1, any of inorganic hard mask intermediate film selected from a silicon oxide film, a silicon nitride film, a silicon oxynitride film, and an amorphous silicon film is formed on the resist under layer film, a resist upper layer film is formed on the inorganic hard mask intermediate film by using a composition for forming the resist upper layer film, a circuit pattern is formed with the resist upper layer film, the inorganic hard mask intermediate film is etched by using the resist upper layer film having the formed pattern as a mask, the resist under layer film is etched by using the inorganic hard mask intermediate film having the formed pattern as a mask, and then the substrate to be processed is etched by using the resist under layer film having the formed pattern as a mask to form the pattern on the substrate to be processed.

12. A patterning process to form a pattern on a substrate to be processed, wherein a resist under layer film is formed on a substrate to be processed by using the method for forming a resist under layer film according to claim 2, any of inorganic hard mask intermediate film selected from a silicon oxide film, a silicon nitride film, a silicon oxynitride film, and an amorphous silicon film is formed on the resist under layer film, a resist upper layer film is formed on the inorganic hard mask intermediate film by using a composition for forming the resist upper layer film, a circuit pattern is formed with the resist upper layer film, the inorganic hard mask intermediate film is etched by using the resist upper layer film having the formed pattern as a mask, the resist under layer film is etched by using the inorganic hard mask intermediate film having the formed pattern as a mask, and then the substrate to be processed is etched by using the resist under layer film having the formed pattern as a mask to form the pattern on the substrate to be processed.

13. A patterning process to form a pattern on a substrate to be processed, wherein a resist under layer film is formed on a substrate to be processed by using the method for forming a resist under layer film according to claim 1, any of inorganic hard mask intermediate film selected from a silicon oxide film, a silicon nitride film, a silicon oxynitride film, and an amorphous silicon film is formed on the resist under layer film, an organic antireflection film is formed on the inorganic hard mask intermediate film, a resist upper layer film is formed on the organic antireflection film by using a composition for forming the resist upper layer film to provide a four-layer resist film, a circuit pattern is formed with the resist upper layer film, the organic antireflection film and the inorganic hard mask intermediate film are etched by using the resist upper layer film having the formed pattern as a mask, the resist under layer film is etched by using the inorganic hard mask intermediate film having the formed pattern as a mask, and then the substrate to be processed is etched by using the resist under layer film having the formed pattern as a mask to form the pattern on the substrate to be processed.

14. A patterning process to form a pattern on a substrate to be processed, wherein a resist under layer film is formed on a substrate to be processed by using the method for forming a resist under layer film according to claim 2, any of inorganic hard mask intermediate film selected from a silicon oxide film, a silicon nitride film, a silicon oxynitride film, and an amorphous silicon film is formed on the resist under layer film, an organic antireflection film is formed on the inorganic hard mask intermediate film, a resist upper layer film is formed on the organic antireflection film by using a composition for forming the resist upper layer film to provide a four-layer resist film, a circuit pattern is formed with the resist upper layer film, the organic antireflection film and the inorganic hard mask intermediate film are etched by using the resist upper layer film having the formed pattern as a mask, the resist under layer film is etched by using the inorganic hard mask intermediate film having the formed pattern as a mask, and then the substrate to be processed is etched by using the resist under layer film having the formed pattern as a mask to form the pattern on the substrate to be processed.

15. The patterning process according to claim 11, wherein the inorganic hard mask intermediate film is formed by a CVD method or an ALD method.

16. The patterning process according to claim 13, wherein the inorganic hard mask intermediate film is formed by a CVD method or an ALD method.

17. The patterning process according to claim 3, wherein the resist upper layer film is patterned by any of the method of photolithography with a high energy beam having a wavelength of 300 nm or less, the method of a direct drawing with an electron beam, the nano-imprinting method, or a combination of these methods.

18. The patterning process according to claim 3, wherein the resist upper layer film is patterned by alkaline development or organic solvent development.

19. The patterning process according to claim 3, wherein the substrate to be processed is a semiconductor substrate coated with any of a metal film, a metal carbide film, a metal oxide film, a metal nitride film, and a metal oxynitride film.

20. The patterning process according to claim 3, wherein the metal that constitutes the substrate to be processed is silicon, titanium, tungsten, hafnium, zirconium, chromium, germanium, copper, aluminum, indium, gallium, arsenic, palladium, iron, tantalum, iridium, molybdenum or an alloy of these metals.

* * * * *